United States Patent [19]
Yamakido et al.

[11] Patent Number: 5,227,795
[45] Date of Patent: Jul. 13, 1993

[54] OVER-SAMPLING ANALOG-TO-DIGITAL CONVERTER USING A CURRENT SWITCHING CIRCUIT AS A LOCAL DIGITAL-TO-ANALOG CONVERTER

[75] Inventors: Kazuo Yamakido, Hinode; Norimitsu Nishikawa, Ohme; Katsuhiro Furukawa, Hamura; Yuko Tamba; Takao Okazaki, both of Ohme, all of Japan

[73] Assignee: Hitachi, Ltd., Tokyo, Japan

[21] Appl. No.: 704,599

[22] Filed: May 23, 1991

[30] Foreign Application Priority Data

May 31, 1990 [JP] Japan ................... 2-142674
Oct. 11, 1990 [JP] Japan ................... 2-273101
Mar. 8, 1991 [JP] Japan ................... 3-69026

[51] Int. Cl.$^5$ ............................. H03M 1/50
[52] U.S. Cl. ...................... 341/166; 341/143
[58] Field of Search ............. 341/143, 144, 155, 158, 341/161, 162, 166; 375/27, 28

[56] References Cited

U.S. PATENT DOCUMENTS

| | | | |
|---|---|---|---|
| 3,624,558 | 11/1971 | Brolin | 341/143 X |
| 3,781,685 | 12/1973 | Ching | 375/27 |
| 4,542,354 | 9/1985 | Robinton et al. | 341/143 X |
| 4,990,914 | 2/1991 | Giancarlo | 341/143 |

OTHER PUBLICATIONS

ISSCC 85, Feb. 13, 1985, Session VII: Data Converters, pp. 80–81.
ISSCC 86, Feb. 20, 1986, Session XIV: Voiceband Telecommuniations ICs, pp. 180–181.
IEEE Journal of Solid-State Circuits, vol. SC-21, No. 6, Dec., 1986, "A 12-bit Sigma-Delta Analog-to-Digital Converter with a 15-MHz Clock Rate", R. Koch et al, pp. 1003–1010.

*Primary Examiner*—Howard L. Williams
*Attorney, Agent, or Firm*—Fay, Sharpe, Beall, Fagan, Minnich & McKee

[57] ABSTRACT

An over-sampling analog-to-digital converter using a current switching circuit 102 as a local digital-to-analog converter, wherein a difference between the output currents Isig and Iq of a voltage-to-current converter circuit 101 and a current switching circuit is integrated by a capacitor 105 of which the one end is grounded to a dc potential VB. Further, the current switching circuit 102 has many bits to decrease the difference current between the signal current Isig and the feedback current signal Iq. Moreover, the level-shifting function of the voltage-to-current converter circuit 101 makes it possible to apparently subtract the dc component from the input analog signal Vsig which is produced based on an internally generated dc voltage as a dc bias voltage, and to decrease a change in the voltage between the electrodes of a capacitor caused by the integration of current.

25 Claims, 20 Drawing Sheets

FIG. 2

| TYPE | F(z) ANALOG | G(z) DIGITAL | DIGITAL OUTPUT Y(z) |
|---|---|---|---|
| ΔM TYPE | 1 | $\frac{z^{-1}}{1-z^{-1}}$ | $Y = z^{-1}(X+N)$ |
| ΔΣ TYPE | $\frac{1}{1-z^{-1}}$ | $z^{-1}$ | $Y = z^{-1}[X+(1-z^{-1})N]$ |
| INTERPOLATION TYPE 1 | $\frac{2-z^{-1}}{1-z^{-1}}$ | $\frac{z^{-1}}{1-z^{-1}}$ | $Y \simeq z^{-1}[X+(1-z^{-1})N]$ |
| INTERPOLATION TYPE 2 | $\frac{1}{1-z^{-1}}$ | $\frac{z^{-1}(2-z^{-1})}{1-z^{-1}}$ | |

( $z^{-1}$: DELAY, $1-z^{-1}$: DIFFERENTIATION
  $1/(1-z^{-1})$: INTEGRATION )

FIG. 3

| TYPE | PASSIVE ELEMENT | G(z) DIGITAL | D/A CONVERSION BITS (NUMBER OF CURRENT SWITCHES) |
|---|---|---|---|
| ΔM TYPE | RESISTOR | INTEGRATION | SAME NUMBER AS THE NUMBER OF INTEGRATION BITS |
| ΔΣ TYPE | CAPACITOR | DELAY | BASICALLY ONE BIT |
| INTERPOLATION TYPE 1 | RESISTOR + CAPACITOR | INTEGRATION | SAME NUMBER AS THE NUMBER OF INTEGRATION BITS |
| INTERPOLATION TYPE 2 | CAPACITOR | INTEGRATION + ADDITION | |

| B0 | B1 | B2 | Iq |
|---|---|---|---|
| 0 | 1 | 1 | 23 Io / 8 |
| 0 | 1 | 0 | 21 Io / 8 |
| 0 | 0 | 1 | 19 Io / 8 |
| 0 | 0 | 0 | 17 Io / 8 |
| 1 | 1 | 1 | 15 Io / 8 |
| 1 | 1 | 0 | 13 Io / 8 |
| 1 | 0 | 1 | 11 Io / 8 |
| 1 | 0 | 0 | 9 Io / 8 |

FIG. 21

| B1 | B2 | B3 | B4 | B5 | C0 | FEEDBACK CURRENT Iq |
|----|----|----|----|----|----|---------------------|
| 1 | 1 | 1 | 1 | 1 | 1 | $-15.5\,I_o$ |
| 1 | 1 | 1 | 1 | 0 | 1 | $-14.5\,I_o$ |
| 1 | 1 | 1 | 0 | 1 | 1 | $-13.5\,I_o$ |
|   |   |   | ⋮ |   |   | ⋮ |
| 1 | 0 | 0 | 1 | 0 | 1 | $-2.5\,I_o$ |
| 1 | 0 | 0 | 0 | 1 | 1 | $-1.5\,I_o$ |
| 1 | 0 | 0 | 0 | 0 | 1 | $-0.5\,I_o$ |
| 0 | 1 | 1 | 1 | 1 | 1 | $+0.5\,I_o$ |
| 0 | 1 | 1 | 1 | 0 | 1 | $+1.5\,I_o$ |
| 0 | 1 | 1 | 0 | 1 | 1 | $+2.5\,I_o$ |
|   |   |   | ⋮ |   |   | ⋮ |
| 0 | 0 | 0 | 0 | 1 | 1 | $+14.5\,I_o$ |
| 0 | 0 | 0 | 0 | 0 | 1 | $+15.5\,I_o$ |

OVER-SAMPLING ANALOG-TO-DIGITAL CONVERTER USING A CURRENT SWITCHING CIRCUIT AS A LOCAL DIGITAL-TO-ANALOG CONVERTER

BACKGROUND OF THE INVENTION

The present invention relates to an analog-to-digital (hereinafter often simply referred to as A/D) converter which converts an analog voltage signal into a corresponding digital signal. More specifically, the invention relates to an A/D converter of the over-sampling type adapted to being realized in a semiconductor integrated circuit, and to a sampling pulse-forming circuit most adapted to the A/D converter. The invention is further related to a current switching circuit whose output current value is controlled by a digital signal which consists of a plurality of bits, and to an A/D converter in which the current switching circuit works as a local digital-to-analog (hereinafter often simply referred to as D/A) converter circuit, and particularly to an over-sampling A/D converter of the type of current integration capable of realizing high-precision conversion characteristics without requiring high precision in the current value.

One of the systems of the A/D converter can be represented by an over-sampling system which uses a sampling frequency that is several tens to several hundreds of times as great as the frequency band of analog input signals. The over-sampling A/D converter can be classified into several types depending on the circuit constitution, such as one of the delta-sigma ($\Delta\Sigma$) type disclosed in, for example, Hauser et al, "MOS Falter . . . " 1985 IEEE International Solid-State Circuits Conference, pp. 80–81, February, 1985 and one of the interpolation type disclosed in for example, Yamakido et al, "A Voiceband 15b Interpolative Converter Chip Set" 1986 IEEE International Solid-State Circuits Conference pp. 180–181, February, 1986. The A/D converters of the over-sampling system require high-speed operation but permit the elements in the analog circuitry to have a greatly decreased level of accuracy compared with those of other non-over-sampling system devices making it therefore possible to relatively easily realize conversion characteristics maintaining high accuracy relying upon a semiconductor integrated circuit. Moreover, a pre-filter that is usually provided in the preceding stage of all A/D converters can be realized in a small size, maintaining loose element accuracy in order to prevent reflection in the band caused by the sampling of high-band noise components included in the input signals.

In many conventional over-sampling A/D converters, however, an operational amplifier has been used the integrated circuit portion for integrating error voltages between the input analog signal and the analog reference signal that is fed back and a limitation is imposed on reducing the electric power consumed by the A/D converter since the operational amplifier must be operated at high speeds. Conversely, a limitation is imposed on the speed of the operational amplifier even if it is attempted to increase the speed by increasing the consumption of the electric power, and it becomes difficult, too, to obtain further increased conversion precision even if the sampling frequency is increased.

The over-sampling A/D converters have heretofore used a power-source voltage which is 5 volts or greater. It was, however, found through study by the present inventors that when it is attempted to adapt the over-sampling A/D converter to small portable communication terminal equipment such as a pager (or generally called pocket bell), a cordless telephone set and a mobile telephone set that have been vigorously developed in recent years, the operation must be sustained on small cells, i.e., the operation must be sustained on a low-voltage power source. Even in this case, the operational amplifier must be operated at high speeds making it further difficult to accomplish the conversion maintaining required accuracy.

In order to solve the above-mentioned problems, furthermore, there has been proposed a circuit system in which no operational amplifier is required for the analog integration circuit portion as is disclosed in Koch et al, "A 12-bit Sigma-Delta Analog-to-digital Converter with a 15-MHz Clock Rate" IEEE, JOURNAL OF SOLID-STATE CIRCUITS, SC-21, December, 1986, pp. 1003–1010. According to this circuit system, the input analog voltage signal is converted into a current signal using a voltage-to-current converter circuit and, at the same time, a local D/A converter circuit is constituted by a current switching circuit of one bit, in order to electrically charge or integrate a differential current between the input signal and the feedback signal using a capacitor whose one end is grounded to a dc potential as an analog integration circuit. Therefore, the above circuit system is of the $\Delta\Sigma$ type.

The voltage-to-current converter circuit for the input signals requires an operational amplifier to maintain linear precision to some extent. The operational amplifier needs to maintain the gain to some extent for the frequency band of the desired input signals. Further, the load that must be driven by the operational amplifier consists solely of a gate electrode of a transistor such as the MOS transistor connected to the current source, in order to decrease the consumption of electric power.

General technical discussions related to the A/D and D/A converters have been published in, for example, Nikkei Journal of Electronics, No. 447, 1988 pp. 165–175, the same journal, No. 452 1988 pp. 277–285, the same journal, No. 493, 1988, pp. 211–221, the same journal, No. 454, 1988, pp. 277–285, ICASSP85, Proceedings, 36. 7. 1–36. 7. 4 (1985), pp. 1400–1403, and Japanese Patent Laid-Open No. 65626/1986.

SUMMARY OF THE INVENTION

The present inventors, however, have found that the conventional circuit constitution described in the Koch et al article involves the problems as described below. That is, the differential current increases due to the fact that the local D/A converter has a one-bit constitution. Therefore, the transistor constituting a current source loses linear characteristics making it difficult to realize desired conversion characteristics. As means for decreasing the noise of quantization, furthermore, there is used a circuit constitution which doubly integrates the voltage of the integration capacitor based on a second voltage-to-current converter circuit that has an operational amplifier. As a result, no consideration has been given to operating the $\Delta\Sigma$-type A/D converter on the low-voltage power source. The above literature refers to the problem concerning variations in the values of the resistors and capacitor elements, but does not teach any concrete solution. It was found by the present inventors that a great many problems arouse when it is attempted to put the A/D converter of the type of current integration into practical use.

In order to obtain a current switching circuit to be used for the over-sampling A/D converter of the current integration type, furthermore, the present inventors have studied the constitution in which a plurality of constant-current source circuits are provided to flow currents weighed by the power of 2 depending on digital signals, current paths of all constant-current source circuits are commonly connected in their way, a current flowing into the connection node is reflected in a current mirror circuit, and a single path of the current that is reflected is coupled as a branching point to a point where the voltage-to-current converter circuit and the analog integration circuit are connected together. Each constant-current source circuit in the above circuit constitution is constituted by connecting a switching MOS transistor that is switched by a digital signal in series with the constant-current source MOS transistor that is biased.

However, the current that flows into the constant-current source MOS transistor varies depending upon the voltage across the drain and the source thereof. It was therefore found that if the ends of the constant-current source circuits are connected in common and if a load such as a current mirror circuit is coupled to the point of common connection, the potential at the point of common connection varies depending upon a current that flows into the current mirror circuit, the conductance of the constant-current source transistor varies depending upon the current that flows into the point of common connection, and an error develops between the digital signal and a current value drawn from the branching point, making it difficult to obtain linear characteristics. In the over-sampling A/D converter which is designed to obtain high conversion accuracy or high signal-to-noise characteristics by using an analog integration circuit, in particular, the necessary conversion accuracy is not guaranteed even if the analog integration circuit is employed unless the current that is drawn in the local D/A converter circuit maintains relatively high linear characteristics.

A first object of the present invention is to provide an over-sampling type A/D converter which consumes small amounts of electric power under a wide range of power source voltage conditions inclusive of low power source voltage operations, and which is capable of realizing stable conversion characteristics for any change in the values of the elements.

A second object of the present invention is to provide an over-sampling type A/D converter which can be mounted on a chip together with a large-scale logic circuit to form a single-chip analog-digital mixed large-scale semiconductor integrated circuit, and of which the conversion characteristics are little deteriorated by the infiltration of digital noise from the logic circuit.

A third object of the present invention is to provide an over-sampling type A/D converter which is capable of effecting the conversion by the over-sampling maintaining higher accuracy than that of the prior art and which is capable of widening the band for the conversion signals without impairing the above-mentioned objects.

A fourth object of the present invention is to provide a sampling pulse-forming circuit that is best adapted to the over-sampling type A/D converters.

A fifth object of the present invention is to provide a current switching circuit which produces output current that is controlled by a digital signal maintaining linear characteristics of high accuracy.

A sixth object of the present invention is to enhance the conversion accuracy in an over-sampling type A/D converter by using a current switching circuit as a local D/A converter circuit, converting the input voltage signal into a current signal, and integrating, using an analog integration circuit, a differential current between the current signal and the feedback current signal that is formed by the current switching circuit.

The above and other objects as well as novel features of the present invention will become obvious from the description of the specification and the accompanying drawings.

Among the inventions disclosed in this application, the outline of a representative example will now be briefly described.

That is, in the A/D converter, a current switching circuit for local D/A conversion is constituted in a plurality of bits, a difference in the output currents between the voltage-to-current converter circuit and the current switching circuit for local D/A conversion is integrated by an analog integration circuit whose one end is grounded to a dc potential, a voltage obtained by the integration thereof is compared with a predetermined threshold voltage by a voltage comparator and is converted into a logic signal, a result thereof is converted into a complement indication signal of 2 (digital signal of the power of 2) consisting of a plurality of bits, and an integrated value of the digital signal is output as a result of A/D conversion and is used as a digital signal that drives the current switching circuit for local D/A conversion.

The A/D converter of the interpolation type is constituted by connecting a capacitor between a predetermined dc potential point and a common connection point at which the output point of the voltage-to-current converter circuit and the output point of the current switching circuit are connected together, or by connecting the capacitor and a resistor in series.

Further, to obtain the A/D converter of the $\Delta M$ type, the current switching circuit for the local D/A conversion is constituted in a plurality of bits, a difference current in the output current between the voltage-to-current converter circuit and the current switching circuit for local D/A conversion is permitted to flow into a resistor element whose one end is grounded to dc potential, a voltage thus obtained is compared with a predetermined threshold voltage by a voltage comparator and is converted into a logical signal, a result thereof is converted into a digital signal of the power of 2 consisting of a plurality of bits, and an integrated value of the digital signal is output as a result of A/D conversion and is used to drive the current switching circuit for local D/A conversion.

In order to easily optimize the sensitivity of the quantizing circuit, the input analog voltage signal is applied, via a resistor element or an equivalent circuit, to an inverted input terminal of the operational amplifier circuit that constitutes the voltage-to-current converter circuit, a dc voltage smaller than a dc bias voltage that is superposed on the input analog voltage signal is supplied to a non-inverted input terminal of the amplifier circuit, in order to impart a function for shifting the dc level of input analog signals and to lower the source and drain potentials of the first N-channel MOS transistor that is coupled to the output terminal of the amplifier circuit, and a voltage that varies with a voltage roughly equal to the dc bias voltage as a center point is applied to a comparator circuit that constitutes the quantizing circuit.

In order that transient response operation of the voltage-to-current conversion circuit and of, the current switching circuit will not undesirably affect the current integration operation of the analog integrating circuit, it is recommended to provide a switching element that is controlled by a sampling pulse signal between the analog integration circuit and a coupling node at which the output point of the voltage-to-current converter circuit and the output point of the current switching circuit are coupled together Or, the voltage-to-current converter circuit and the current switching circuit should be periodically operated depending on the sampling pulse signals.

In order to realize the interpolation-type A/D converter maintaining high precision and to stabilize the operation in relation to the sampling pulse signals, the pulse width ($\tau$) of the sampling pulse signals should be set to be roughly equal to a time constant cR of the analog integration circuit.

In order to realize the above-mentioned condition $\tau=cR$ by cancelling variations in the capacitor and the resistor element using pulse width, the pulse width ($\tau$) of the sampling pulse signals should be determined by using a sampling pulse-forming circuit which is comprised of a voltage-to-current converter circuit that converts the reference voltage into a current value, a switch and a capacitor for sampling and integrating a current from the above converter circuit with clock pulses of the same frequency as that of the A/D converter, a voltage comparator circuit that compares the integrated voltage of the capacitor with a predetermined threshold value to produce an output of a logic level, a logic circuit that generates a desired pulse width from the clock pulse based on the logic output of the comparator circuit, and a reset circuit for discharging the electric charge of the integration capacitor.

A current switching circuit that works as a local D/A converter circuit in the current integration-type A/D converter comprises a plurality of current output paths in which electric currents flowing into constant-current source transistors are reflected via a current mirror circuit, the current output paths being connected in common to the output terminal, and a switching element that determines whether the current should be permitted to flow into the current output paths depending upon a digital signal, thereby to control the current value output from the output terminal depending upon the digital signals.

When the constant-current source transistors are provided in a one-to-one manner relative to the current output paths via the current mirror circuit, the switching element can be disposed in series with the constant-current source transistors. As described above, the circuit constituted for each of the current output paths is grasped as a current output unit cell. For instance, the current output unit cells of a number necessary for flowing currents weighed by the power of 2 depending upon the digital signal are regarded as a unit circuit, and the switching element is constituted for every unit circuit so as to be controlled by a common signal Then, the current switching circuit works as a D/A converter circuit that converts a binary digital signal into an analog current signal.

It is also allowable to dispose the switching element in each of the current output paths in order to decrease the number of transistors by commonly utilizing the constant-current source transistors for the current output paths via the current mirror circuit. Thus, the circuit constituted for each current output path is grasped as a current output unit cell. For instance, the current output unit cells of a number necessary for flowing currents that are weighed by the power of 2 depending on the digital signal are regarded as a unit circuit, and the switching element is constituted for each of the unit circuits so as to be controlled by a common signal. Then, the current switching circuit works as a D/A converter circuit that converts a binary digital signal into an analog current signal.

Furthermore, the current switching circuit may be so constructed that there are provided a plurality of constant-current source circuits to flow currents weighed by the power of 2 being controlled by the digital signals, the current paths of all constant-current source circuits are commonly connected, a current flowing into the connection node is reflected by the current mirror circuit, and a single path of the reflected current is coupled to the output terminal. In this case, the transistor that works as a variable resistance means is connected in series with the constant-current source transistor that is included in the constant-current source circuit, and the conductance of the transistor that works as the above-mentioned variable resistance means is controlled in order to offset a change in the conductance of the above constant-current source transistor for a transistor that supplies a bias voltage to the constant-current source transistor.

In the current integration-type A/D converter, the current switching circuit that is constituted in many bits in the local D/A converter circuit helps decrease the difference between the input signal current and the feedback current signal. Furthermore, the level-shifting function of the voltage/current converter circuit works to subtract the dc component from the input analog signal that consists of an internally generated dc voltage as a dc bias voltage. This further works to decrease a change in voltage across the terminals of the capacitor caused by the integration of current. Therefore, the input voltage-to-current converter circuit and the constant-current source MOS transistor constituting the local D/A converter circuit operate stably, eventually making it possible to lower the power source voltage for the A/D converter and to decrease the consumption of electric power.

The current switching circuit which is a local D/A converter circuit constituted in many bits works to decrease the quantized electric power of noise. This helps further lower the sampling frequency for obtaining a required conversion accuracy, and contributes to decreasing the speed of circuit operation. This helps further decrease the consumption of electric power. At the same time, it is allowed to greatly loosen the precision requirements for the elements such as capacitors, resistors, and current source transistors.

Moreover, the analog integration circuit consisting of a passive element connected to a dc potential point is of the grounded type instead of the imaginary grounded type which, in principle, is most susceptible to receiving digital noise from the logic circuit. This fact contributes to realizing an A/D converter that stably operates against variation in the power source voltage and digital noise.

In the current switching circuit that is utilized as a local D/A converter circuit in the A/D converter, a reflected current of the current flowing into the constant-current source circuit flows, via the current mirror circuit, to the current output paths that are commonly connected to the output terminal. This is effective in maintaining constant the conductance of the constant-current source transistor that constitutes the constant-current source circuit irrespective of the magnitude in the current value at the output terminal. Therefore, when the output current at the output terminal is controlled by digital signals having various values, linear characteristics of high accuracy are maintained by the output current values that vary depending on the digital signal values.

When the current switching circuit that operates as mentioned above is employed as a local D/A converter circuit in the over-sampling A/D converter of the type of analog integration, furthermore, the output current value of the current switching circuit forms a differential current from a current signal that is converted by the input voltage-to-current conversion means. Therefore, the over-sampling A/D converter exhibits an improved conversion accuracy in that the differential current is highly accurately controlled depending upon the digital signals.

BRIEF DESCRIPTION OF THE DRAWINGS

FIG. 2 is a diagram explaining transfer functions of a variety of over-sampling A/D converters;

FIG. 3 is a diagram explaining passive elements constituting analog circuits that correspond to various A/D conversion systems shown in FIG. 2; and the kinds of digital circuits;

FIG. 21 is a diagram explaining the relationships between digital signals fed to the current switching circuit shown in FIG. 20 and feedback currents Iq;

DESCRIPTION OF THE PREFERRED EMBODIMENTS

Figure 1:
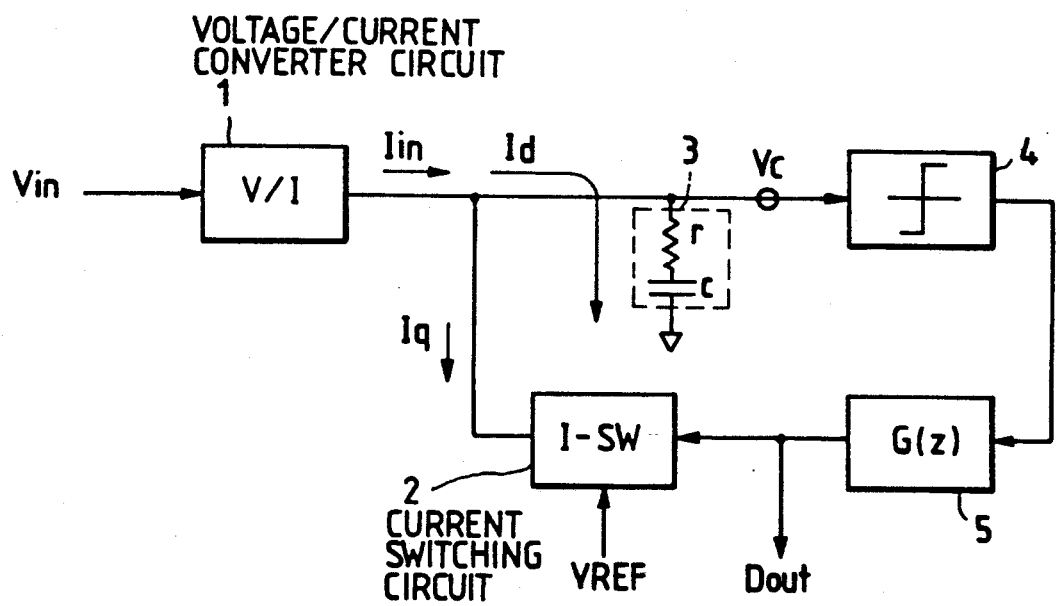
FIG. 1 is a diagram showing the fundamental constitution of an over-sampling A/D converter according to an embodiment of the present invention.

FIG. 1 is a diagram showing the fundamental constitution of an over-sampling A/D converter according to the present invention, wherein a voltage-to-current converter circuit 1 converts an analog input signal Vin inclusive of a dc value into a current signal Iin proportional thereto. A current switching circuit 2 works as a local D/A converter and outputs a quantized feedback current signal Iq that corresponds to a result of A/D conversion of an input signal of up to one sampling before. An analog circuit 3 constituted by a capacitor or a resistor element, or by a capacitor and a resistor element whose one end is grounded in an ac manner, is connected to a difference point of the two current signals. A quantizing circuit 4 exhibits a sufficiently high input impedance provided there is employed, for example, metal oxide silicon (MOS)-type or junction-type field-effect transistor technology.

During each sampling period, therefore, a difference current Id (=Iin−Iq) flows into the circuit 3, and is integrated by the circuit 3 as shown. During the non-sampling period, the two current signals Iin and Iq are both cut off, and a difference point of the two current signals acquires a high impedance, causing the integration circuit to be placed under the holding condition. Just before the holding condition or during the holding condition, a voltage Vc of the integration circuit is converted into a digital signal consisting of one bit or a plurality of bits through the quantizing circuit 4 that has a voltage comparator circuit. By outputting the digital signal through a digital circuit 5, there is obtained a result of A/D conversion.

As described above, the analog integration circuit 3 of this embodiment is constituted by passive elements such as a resistor element r and a capacitor c, without using active elements such as transistors. Moreover, the analog integration circuit 3 is constituted without using an operational amplifier. The output Dout of the digital circuit 5 is passed through a decimator or decimation circuit that is not shown to obtain an average value thereof consisting of many bits after a predetermined period.

FIG. 2 shows transfer functions of over-sampling A/D converters of the $\Delta$M-type, $\Delta\Sigma$-type, interpolation type 1 and interpolation type 2. The transfer functions F(z) and G(z) of the analog integration circuit and of the digital integration circuit are usually expressed by a function z [Z=exp(JωT), where z=exp( ) is an exponential function, jω is a complex angular frequency, and T is one sampling period]. For instance, $Z^{-1}$ represents a delay of one sampling period in the signal phase, $1/(1-z^{-1})$ represents an integration, $(1-z^{-1})$ represents a differentiation. Here, the delay component $(z^{-1})$ of one sampling period in the signal phase included in the description of F(z) or G(z) corresponding to the integration circuit is described to be contained in the circuit for the purpose of easy explanation. In fact, however, the delay component $(z^{-1})$ is generated being dispersed in each of the circuit in the loop as will be described later. Furthermore, the loop delay which is greater than two sampling periods does not particularly affect the conversion accuracy.

The $\Delta$M (delta-M)-type converter is constituted by using the digital integration circuit 5 along without using the analog integration circuit. Therefore, the equation 1 is obtained if a transfer function is found between the z functions X(z) and Y(z) of the input voltage signal Vin and the output digital signal Dout where F(z)<1 and $G(z)=z^{-1}/(1-z^{-1})$. Here, N(z) denotes quantized noise (or quantized error) generated by the quantization.

$$Y(z)=z^{-1}\cdot[X(z)+N(z)] \qquad [Eq. 1]$$

The $\Delta\Sigma$ (delta-sigma)-type converter is constituted by using the analog integration circuit 3 alone without using the digital integration circuit 5 just contrary to that of the above $\Delta$M-type. Therefore, the following equation 2 is obtained if a transfer function is found under the condition where $F(z)=1/(1-z^{-1})$ and $G(z)=z^{-1}$.

$$Y(z)=z^{-1}\cdot[X+(z)+N(z)] \qquad [Eq. 2]$$

The interpolation-type converter is constituted by using both the analog integration circuit 3 and the digital integration circuit 5. That is, since the A/D converter of the interpolation type contains two integration circuits to generate a delay of signal phase in the loop, the negative feedback may in the worst case turn into positive feedback to develop oscillation. It is therefore necessary to contrive that at least one of the integration circuits has an advanced phase. For instance, it is allowable to obtain an equation 3 that corresponds to the interpolation type 1 under the condition where (F(z)= $(2-z^{-1})/(1-z^{-1})$ and $G(z)=z^{-1}/(1-z^{-1})$. It is further allowable to obtain an equation 4 corresponding to the interpolation type 2 under the condition where $F(z)=1/(1-z^{-1})$ and $G(z)=z^{-1}\cdot(2-z^{-1})/(1-z^{-1})$.

$$\begin{aligned} Y(z) &= z^{-1}\cdot[(2-z^{-1})X(z)+(1-z^{-1})N(z)] \\ &\approx z^{-1}[X(z)+(1-z^{-1})N(z)] \end{aligned} \qquad [Eq. 3]$$

$$\begin{aligned} Y(z) &= z^{-1}\cdot(2-z^{-1})\cdot[X(z)+(1-z^{-1})N(z)] \\ &\approx z^{-1}\cdot(X(z)+(1-z^{-1})N(z)) \end{aligned} \qquad [Eq. 4]$$

In the converters of the $\Delta\Sigma$-type and the interpolation type having the analog integration circuit 3, the quantized noise N(z) is multiplied by the coefficient $(1-z^{-1})$ of differentiation as represented by the equations 2, 3 and 4. This means that the quantized noise is greatly attenuated at low frequencies. In principle, therefore, the converters of the $\Delta\Sigma$-type and the interpolation type exhibit a conversion accuracy or an S/N (signal-to-quantized noise power ratio) which is higher than that of the $\Delta$M-type converter.

FIG. 3 shows the kinds of passive elements for constituting analog integration circuits and the kinds of digital circuits corresponding to various A/D conversion types shown in FIG. 2.

Figure 4:
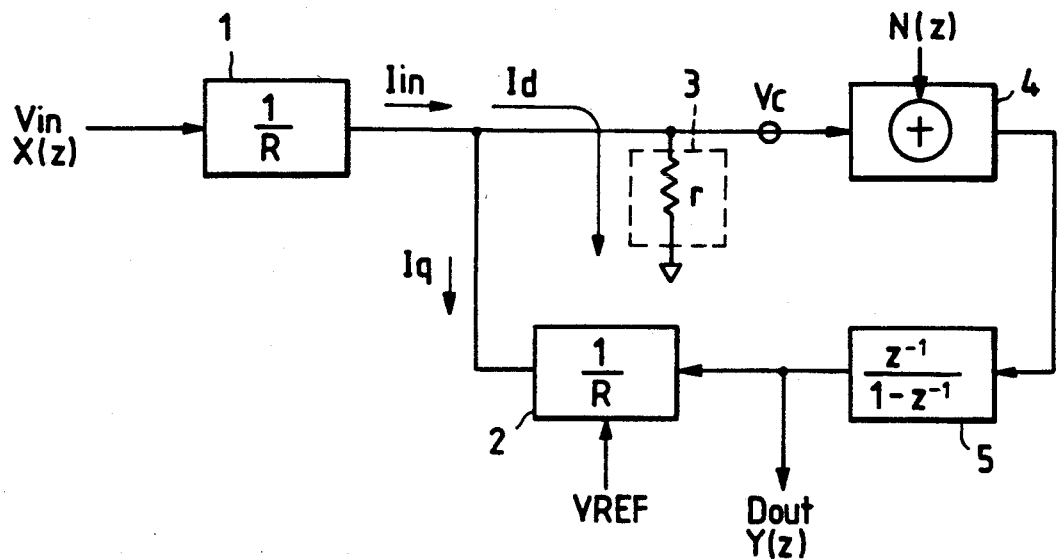
FIG. 4 is a block diagram of a delta-M-type over-sampling A/D converter according to an embodiment of the present invention.

FIG. 4 shows a $\Delta$M-type A/D converter according to an embodiment of the present invention. Here, though there is no particular limitation, a conversion coefficient of the voltage-to-current converter circuit 1 is set to be 1/R (i.e., Iin=Vin/R). As for the current switching circuit 2, furthermore, the reference voltage VREF, which can be set to any value, is set to a value approximately equal to a maximum amplitude Vin(max) of input voltage signals to simplify the description, and a conversion coefficient for a maximum output current Iq(max) is set to 1/R to be equal to that of the voltage-to-current converter circuit 1. The same holds hereinafter.

Figure 5:
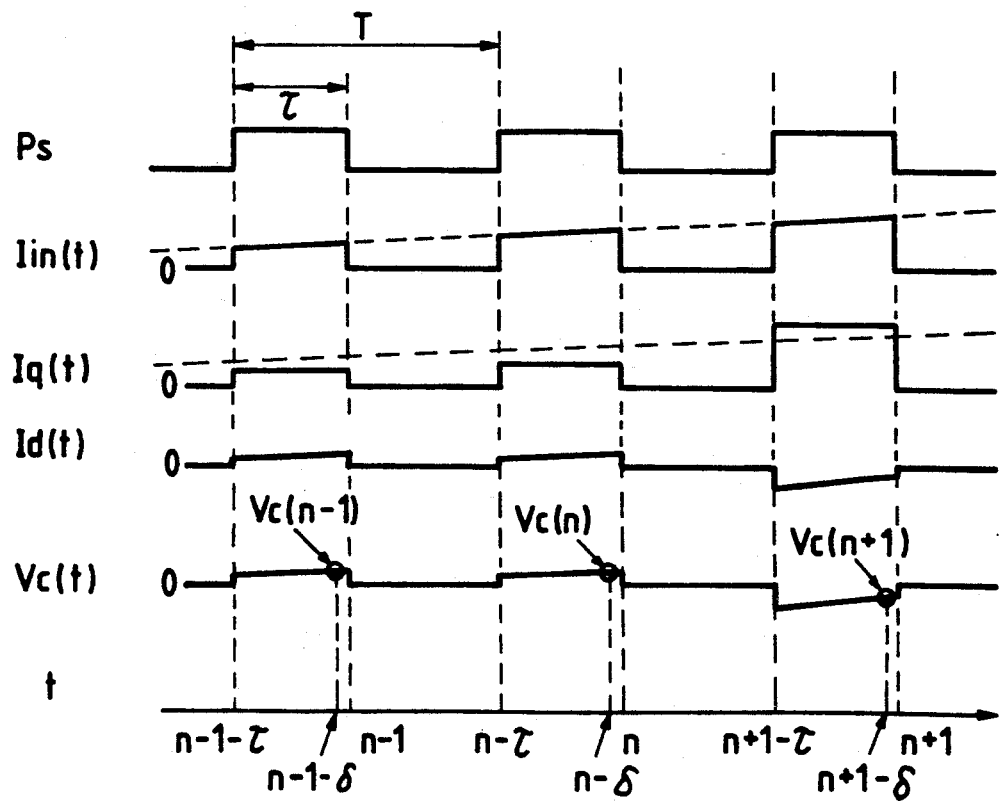
FIG. 5 is a diagram for explaining the operation of the A/D converter that is shown in FIG. 4.

The $\Delta$M-type converter does not use the analog integration circuit as described above and, hence, the analog circuit 3 is constituted by a resistor element (having a resistance r) only. FIG. 5 shows current or voltage waveforms at each of the portions to explain the operation of the A/D converter that is shown in FIG. 4, wherein t denotes the time. Both the input current signal Iin and the feedback current signal Iq are sampled during a time τ only in the sampling period T, and are output. Therefore, the difference current Id flows into the resistor element 3 only during the time τ in each sampling period and becomes zero in the times other than τ, whereby the voltage Vc across the resistor element r of analog circuit 3 becomes as shown in FIG. 5. If now the voltage Vc across the resistor element r at a time t=n−δ just before the completion of the sampling time is denoted by Vc(n), then Vc(n) can be expressed by an equation 5 where X(z) and Y(z) are z functions of the input voltage signal Vin and the digital output signal Dout.

$$\begin{aligned} Vc(n) &= r\cdot Id(n) \\ &= r\cdot[Iin(n)-Iq(n)] \\ &= (r/R)\,[X(z)-Y(z)] \end{aligned} \qquad [Eq. 5]$$

On the other hand, if the digital circuit 5 is a digital integration circuit having a transfer function $G(z)=z^{-1}/(1-z^{-1})$, then there is obtained an equation 6. If the equation 5 is substituted for the equation 6 and is rearranged, there is obtained an equation 7. Therefore, if $r=R$ in the equation 7, there is obtained the following equation 8.

$$Y(z)=\{z^{-1}/(1-z^{-1})\}\cdot\{Vc(z)+N(z)]  \qquad [Eq.\ 6]$$

$$[1+(r/R-1)z^{-1}]\cdot Y(z)=z^{-1}\cdot[(r/R)\cdot Z(z)+N(z)] \qquad [Eq.\ 7]$$

$$Y(z)=z^{-1}\cdot[X(z)+N(z)] \qquad [Eq.\ 8]$$

This equation 8 is the same as the equation 1 mentioned earlier from which it is obvious that the constitution of FIG. 4 helps realize the converter of the ΔM type. Here, the ΔM-type converter uses the current switching circuit 2 of many bits corresponding to the bit constitution of the digital integration circuit 5. Therefore, the amplitude of the feedback current signal Iq becomes close to the amplitude of the input signal Iin, and the difference current Id possesses a relatively small amplitude.

Figure 6:
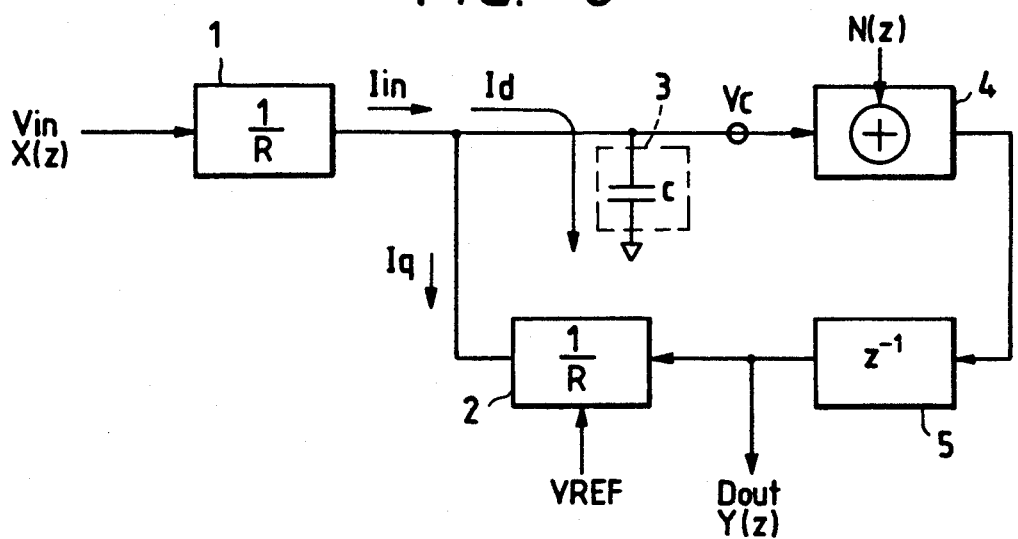
FIG. 6 is a block diagram of a delta-sigma-type over-sampling A/D converter according to an embodiment of the present invention.

FIG. 6 shows an A/D converter of the ΔΣ type. In this case, the analog circuit 3 is constituted by an integration circuit consisting of a capacitor (capacitance c) whose one end is grounded, and the digital circuit 5 is constituted by a delay circuit with $G(z)=z^{-1}$ in contrast converter of the ΔM type of FIG. 4 and, further, the current switching circuit 2 is realized by the one-bit constitution to correspond thereto. Therefore, the amplitude of the feedback current signal Iq assumes two values, i.e., ±Iq(max) that do not directly correspond to the amplitude of the input current signal Iin, and the difference current Id assumes a relatively large amplitude.

Figure 7:
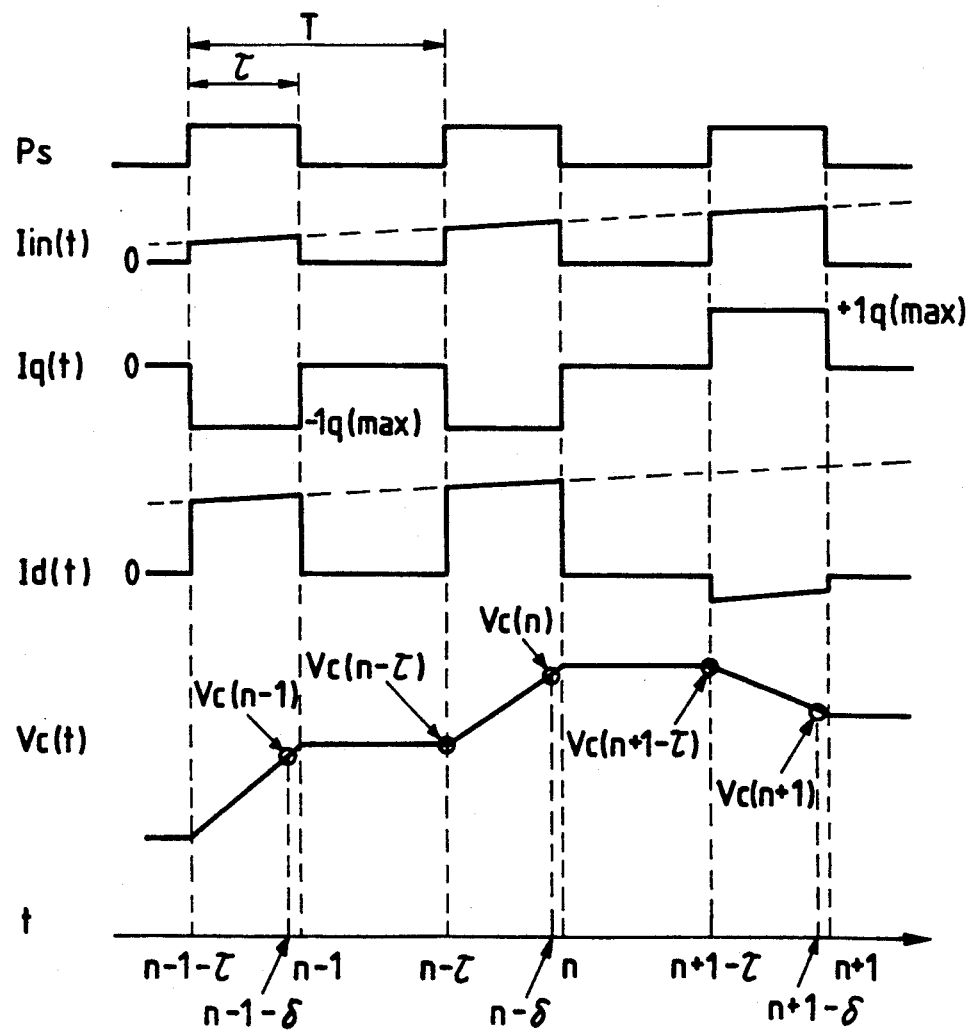
FIG. 7 is a diagram for explaining the operation of the A/D converter that is shown in FIG. 6.

In this case, the difference current Id is integrated by the capacitor 3, and the voltage Vc at the difference point assumes a waveform shown in FIG. 7. That is, the voltage Vc(n) of the analog integration circuit 3 at a moment $t=n-\delta$ (or at any suitable moment during the holding time of from $t=n$ up to $t=n+1-\tau$) just before the completion of the sampling time, is given by the following equation 9.

$$Vc(n) - Vc(n-1) = (1/c)\int_{n-\tau}^{n} Id(t)dt \qquad [Eq.\ 9]$$

If now the input current signal Iin or the difference current signal Id changes little within the time τ, i.e., $Id(n-\tau)=Id(n)$, the equation 9 can be rewritten as the following equation 10 since $Vc(n-\tau)\approx Vc(n-1)$ during the holding time. In practice, this assumption holds true when the oversampling frequency is relatively high. If the equation 10 is subjected to the z-conversion, there is obtained an equation 11. In this case, since there holds an equation 12, the equation 11 is substituted for the equation 12 and is rearranged to obtain the following equation 13. Therefore, if $\tau=cR$, there is obtained the following equation 14 which is the same as the equation 2 mentioned earlier. It is hence obvious that the constitution of FIG. 6 realizes the A/D converter of the ΔΣ type.

$$\begin{aligned}(Vc(n) - Vc(n-1)) &= (\tau/c)\cdot Id(n) \\ &= (\tau/c)\cdot[Iin(n) - Iq(n)]\end{aligned} \qquad [Eq.\ 10]$$

$$(1-z^{-1})Vc(z)=(\tau/c)\cdot[Iin(z)-Iq(z)] \qquad [Eq.\ 11]$$

$$Y(z)-z^{-1}\cdot[Vc(z)+N(z)] \qquad [Eq.\ 12]$$

$$[1+(\tau/c/r-1)z-1]Y(z)=z^{-1}\cdot[(\tau/cR)\cdot X(z+(1-z^{-1})N(z)] \qquad (8\ Eq.\ 13)$$

$$Y(z)=z^{-1}\cdot[X(z+(-z^{-1})N(z) \qquad [Eq.\ 14]$$

Figure 8:
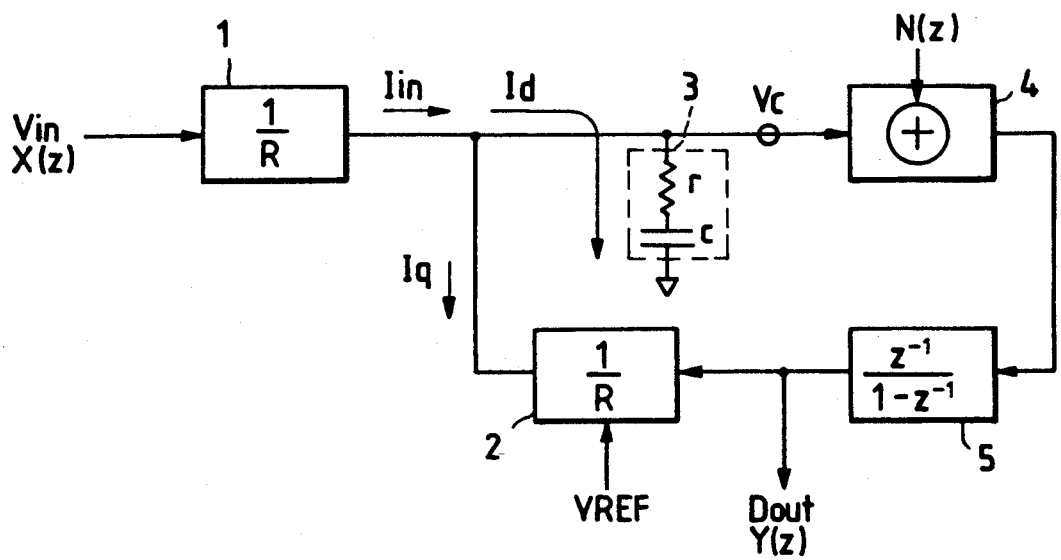
FIG. 8 is a block diagram of an interpolation-type A/D converter according to an embodiment of the present invention.
Figure 9:
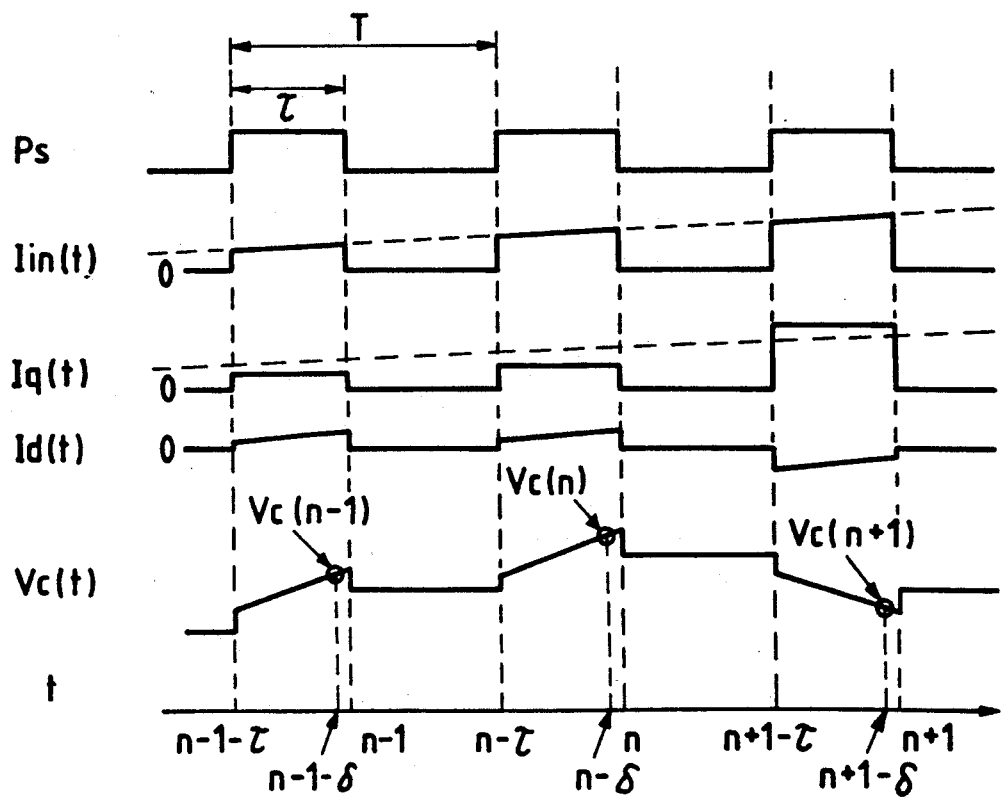
FIG. 9 is a diagram for explaining the operation of the A/D converter that is shown in FIG. 8.

Next, FIG. 8 shows an interpolation type A/D converter according to a first embodiment of the present invention which is the same as the ΔM-type converter of FIG. 4 except that the analog circuit 3 is an integration circuit consisting of a capacitor (capacitance c) whose one end is grounded and a resistor element (resistance r) that are connected in series. The resistor element works to compensate the loss of balance in the circuit operation caused by a delay of signal in the loop. In this case, the difference current Id is integrated by the capacitor c in the analog circuit 3 and, at the same time, produces a voltage across the resistor element. Therefore, the voltage Vc at the difference point assumes the waveform as shown in FIG. 9, and is expressed by the following equation 15.

$$Vc(n) - Vc(n-1) = \qquad [Eq.\ 15]$$
$$(1/c)\int_{n-\tau}^{n} Id(t)dt + r\cdot\{Id(n) - Id(n-1)]$$

If now the input current signal Iin or the difference current signal Id change little within the time τ, i.e., $Id(n-\tau)\approx Id(n)$, then the equation 15 can be rewritten as the following equation 16. In practice, this assumption holds true when the over-sampling frequency is relatively high. The equation 16 is subjected to the z-conversion to obtain an equation 17.

$$\begin{aligned}Vc(n) - Vc(n-1) &\qquad [Eq.\ 16] \\ &= (r+\tau/c)\cdot Id(n) = r\cdot Id(n-1) \\ &= (r+\tau/c)\cdot[Iin(n) - Iq(n)] - \\ &\quad r\cdot[Iin(n-1) - Iq(n-1)]\end{aligned}$$

$$(1-z^{-1})Vc(z)=[r(1-z^{-1})+\pi/c]\cdot[Iin(z)-Iq(z)] \qquad [Eq.\ 17]$$

There further holds an equation 18 which is then substituted for the equation 17 and is rearranged to obtain an equation 19. Therefore, if $r=R$ and $\tau=cr$, the following equation 20 is obtained.

$$\begin{aligned}Iin(z) &= Z(z)/R \\ Iq(z) &= Y(z)/R \\ Y(z) &= [z^{-1}/(1-z^{-1})]\cdot[Vc(z)+N(z)]\end{aligned} \qquad [Eq.\ 18]$$

$$\begin{aligned}&[1+\{(r/R)(1+\tau/cr)-2\}z^{-1}+(1-r/R)z^{-2}]\cdot \\ &\quad Y(z) = (r/R)\{(1+\tau/cr)-z^{-1}\}z^{-1}\cdot X(z)+(1-z^{-1})z^{-1}N(z)\end{aligned} \qquad [Eq.\ 19]$$

$$Y(z) = z^{-1}\cdot\{(2-z^{-1})X(z)+(1-z^{-1})N(z)] \qquad [Eq.\ 20]$$

The equation 20 is the same as the above equation 3, from which it is obvious that the constitution of FIG. 8 realizes the A/D converter of the interpolation type. The analog integration circuit 3 of this embodiment is constituted by a resistor element that works as a passive element and a capacitor element, without including circuit means that works as an active element. Further, the integration circuit is constituted without using the operational amplifier.

Figure 10:
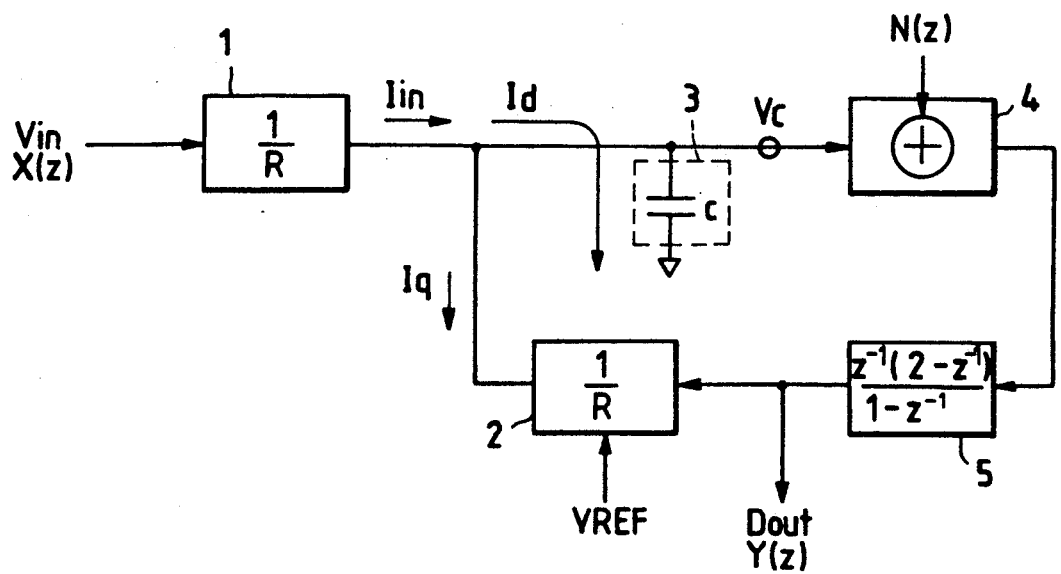
FIG. 10 is a block diagram of another interpolation-type A/D converter according to an embodiment of the present invention.
Figure 11:
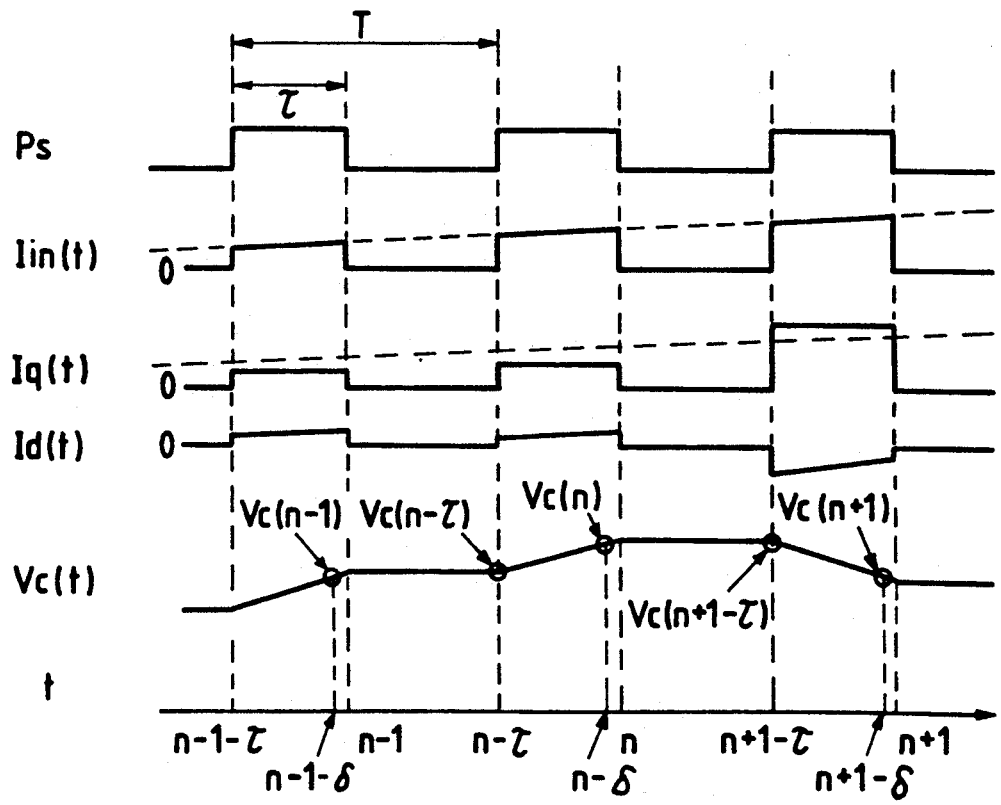
FIG. 11 is a diagram for explaining the operation of the A/D converter that is shown in FIG. 10.

FIG. 10 shows the interpolation-type A/D converter according to a second embodiment of the present invention. The converter of this embodiment has the same constitution as the interpolation-type converter of the first embodiment shown in FIG. 8 except that the analog circuit 3 is an integration circuit constituted by a capacitor (capacitance c) whose one end is grounded, and that the digital circuit 5 is a digital integration circuit having a transfer function $G(z) = z^{-1}(2-z^{-1})/(1-z^{-1})$. Therefore, the voltage Vc produced by the difference current Id at the difference point has a waveform as shown in FIG. 11, which is given by the following equation 21 that is the same as the afore-mentioned equation 11.

$$(1-z^{-1})Vc(z) = (\tau/c)\cdot[Iin(z) - Iq(z)]$$ [Eq. 21]

There further holds an equation 22 which is then substituted for the equation 21 and is rearranged to obtain an equation 23. If $\tau = cR$ in the equation 23, then there is obtained the following equation 24.

$$Y(z) = [z^{-1}(2-z^{-1})/(1-z^{-1})]\cdot[Vc(z) + N(z)]$$ [Eq. 22]

$$[1+(\tau/cR-1)z^{-1}(2-a^{-1})]\cdot Y(z) = z^{-1}(2-z^{-1})\cdot[\tau/cR)\cdot X(z) + (1-z^{-1})N(z)]$$ [Eq. 23]

$$Y(z) = z^{-1}(2-z^{-1})\cdot[X(z) = (1-z^{-1})N(z)]$$
$$\approx z^{-1}\cdot[X(z) = (1-z^{-1})N(z)].$$ [Eq. 24]

This equation 24 is the same as the above-mentioned equation 4, from which it is obvious that the constitution of FIG. 10 realizes the interpolation-type A/D converter.

Figure 12:
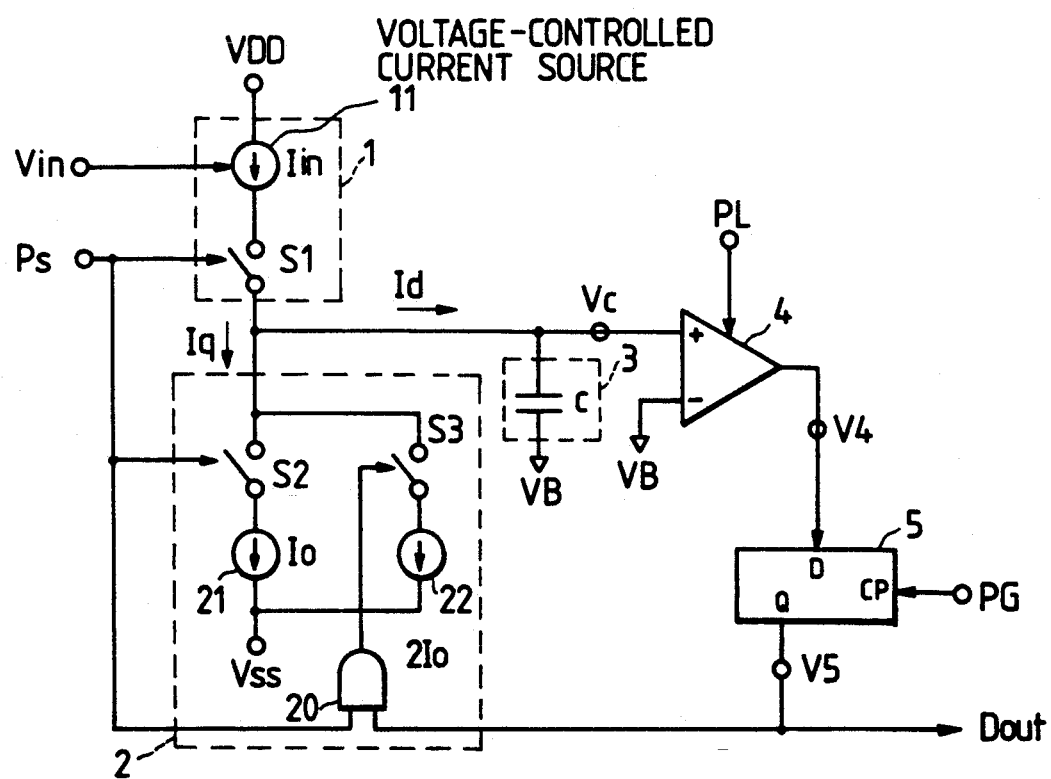
FIG. 12 is a circuit diagram showing a concrete embodiment of the delta-sigma-type over-sampling A/D converter that is shown in FIG. 6.
Figure 13:
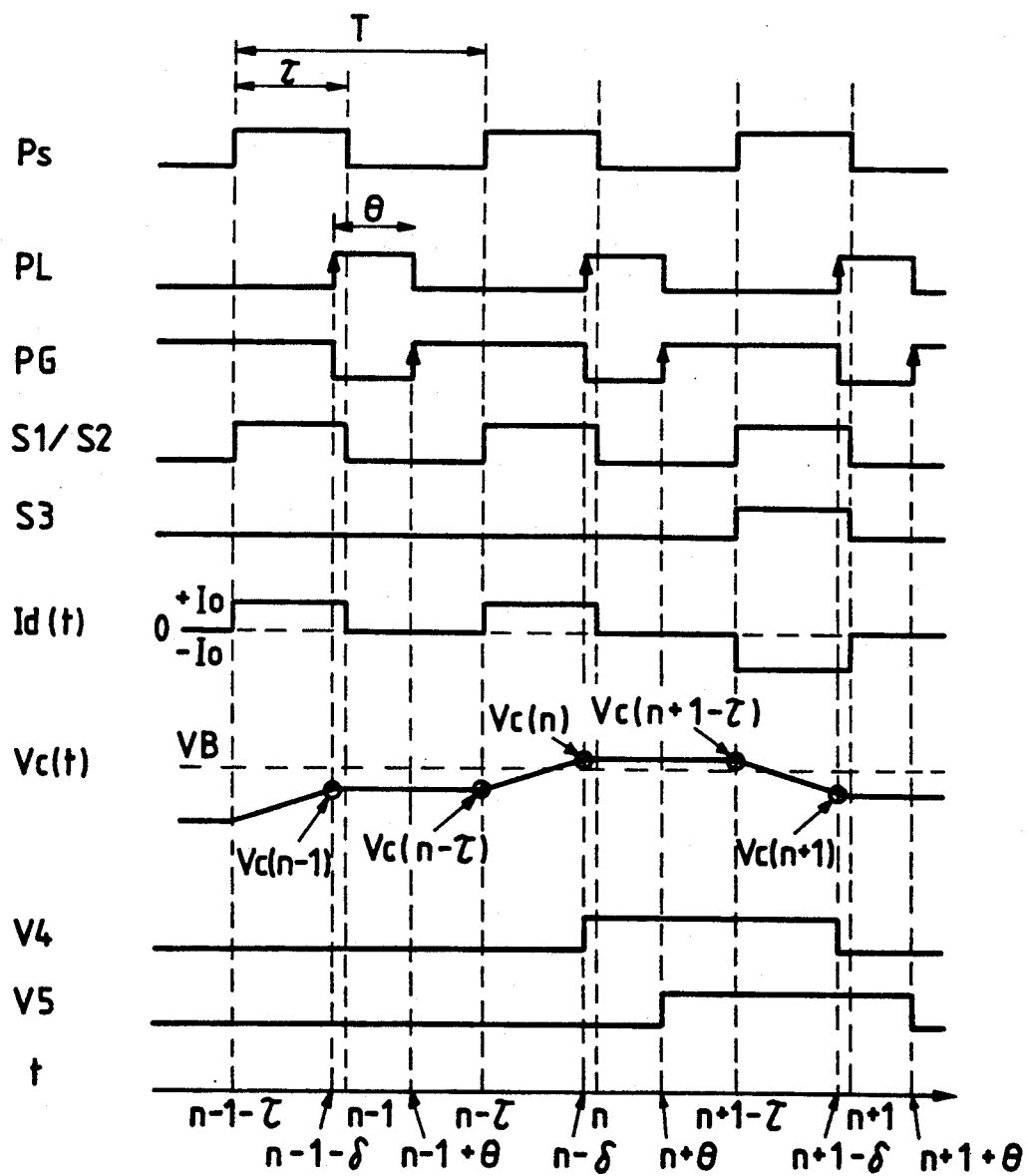
FIG. 13 is a diagram for explaining the operation of the A/D converter that is shown in FIG. 12.

FIG. 12 shows a concrete circuit for realizing the $\Delta\Sigma$-type A/D converter of FIG. 6, and FIG. 13 shows waveforms at each of the portions for explaining the operation of the circuit that is shown in FIG. 12. In FIG. 12, the voltage-to-current converter circuit 1 is constituted by a voltage-controlled current source 11 (current value Iin) which is connected to a first power source voltage VDD to generate a current proportional to the input voltage signal Vin, and a switch S1 that is controlled by a sampling pulse Ps. The analog circuit 3 is constituted by a capacitor c whose one end is grounded to a bias dc voltage VB and works as an analog integration circuit. The quantizing circuit 4 (which is not particularly diagramed) is constituted by a voltage comparator and a latch circuit which amplifies the result of comparison up to a voltage level capable of operating the logic circuit and of which the logic output is varied by, for example, the rising edge of the latch pulse PL. The digital circuit 5 is a latch circuit which delays the output of the quantizing circuit 4 up to, for example, the rising edge of the pulse PG. The current switching circuit 2 is constituted by constant-current circuits 21 (having a current Io) and 22 (having a current 2Io) of which the ends on one side are connected to a second power source voltage Vss and which convert the reference voltage into currents through the same circuit as the aforementioned voltage-to-current converter circuit 1, a switch S2 controlled by the sampling pulse Ps, a logic circuit 20, and a switch S3 controlled by the output of the logic circuit 20. Being constituted as described above, the current Iin of the signal current source 11 varies maintaining an amplitude of $\pm$Isig (where Isig has a maximum value Io) with the direct current 2Io as a center. Here, to simplify the description, it is presumed that Isig$\approx$0 (i.e., Iin$\approx$2Io).

As shown in FIG. 13, the switches S1 and S2 are simultaneously turned on only during the time $\tau$ by the sampling pulses Ps that rise at times $t=n-1-\tau$, $t=n-\tau$, $t=n+1-\tau$, ... and that break at $t=n-1$, $t=n$ $t=n+1$, ... in each of the sampling periods T. If now the output V5 of the digital circuit 5 has a low logic level at a time $t=n-1-\tau$, the output of the logic circuit 20 assumes the low logic level, too, and the switch S3 remains turned off. Therefore, since the feedback current is Iq=Io and the current of the signal current source 11 is Iin$\approx$2Io, the capacitor c is electrically charged by the difference current Id which is nearly equal to Io from the time $t=n-1\tau$ up to the time $r=n-1$.

Though there is no particular limitation, the quantizing circuit 4 compares the voltage Vc(n-1) of the analog integration capacitor c at a moment just before the time $t=n-1$, i.e., at the time $t=n-1-\delta$ with the bias dc voltage VB in regard to their magnitude. Here, if $Vc(n-1)<VB$, then the output V4 assumes the low logic level. As a result, the output V5 of the digital circuit 5 assumes the low logic level at the time $t=n-1+\theta$.

Even during the next period from the sampling time $t=n-\tau$ to the time $t=n$, the switch S3 remains turned off as in the previous time. Therefore, the feedback current Iq=Io and the current of the signal current source 11 is Iin$\approx$2Io. That is, the capacitor c is electrically charged with the difference current Id which is nearly equal to Io. As a result, if the voltage Vc(n) of the analog integration capacitor C becomes greater than VB at a moment just before the time $t=n$, i.e., at the time $t=n-\delta$, the output V4 of the quantizing circuit 4 assumes the high logic level, and the output V5 of the digital circuit 5 assumes the high logic level, too, at the time $t=n+1+\theta$.

In the next period from the sampling time $t=n+1-\tau$ to $t=n+1$, the switches S1, S2 and S3 are all turned on unlike the previous time, and the feedback current becomes Iq=3Io. Therefore, the difference current Id which is nearly equal to $-Io$ discharges the capacitor c for the current Iin$\approx$2Io for the current Iin$\approx$2Io of the signal current source 11. As a result, if the voltage Vc(n+1) of the analog integration capacitor c becomes smaller than VB at a moment just before the time $t=n+1$, i.e., at the time $t=n+1-\delta$, then the output V4 of the quantizing circuit 4 assumes the low logic level and the output V5 of the digital circuit 5 assumes the low logic level, too, at the time $t=n+0$.

The output V5 of the digital circuit 5 in the above repetition is the output of the $\Delta\Sigma$-type A/D converter forming, in this case, a compression modulated wave of binary digital signals. Though the current switching circuit 2 was constituted by two constant-current sources having current values Io, 2Io in the foregoing description, the present invention is in no way limited thereto. That is, though there is shown no circuit diagram, it is also allowable to quantize the voltage Vc at the difference point into a plurality of bits by using a plurality of quantizing circuits and to constitute the current switching circuit 2 using a plurality of constant-current sources having current values weighed by the power of 2 so as to be corresponded thereto. Furthermore, though the switches were described in the foregoing to be enabled on the high logic level and to be turned off on the low logic level, their relationships may be reversed. Moreover, though the logic circuits were described to change their output conditions at the rising edge of the clock pulses, there is imposed no particular limitation. The same holds even in the following description.

Figure 14:
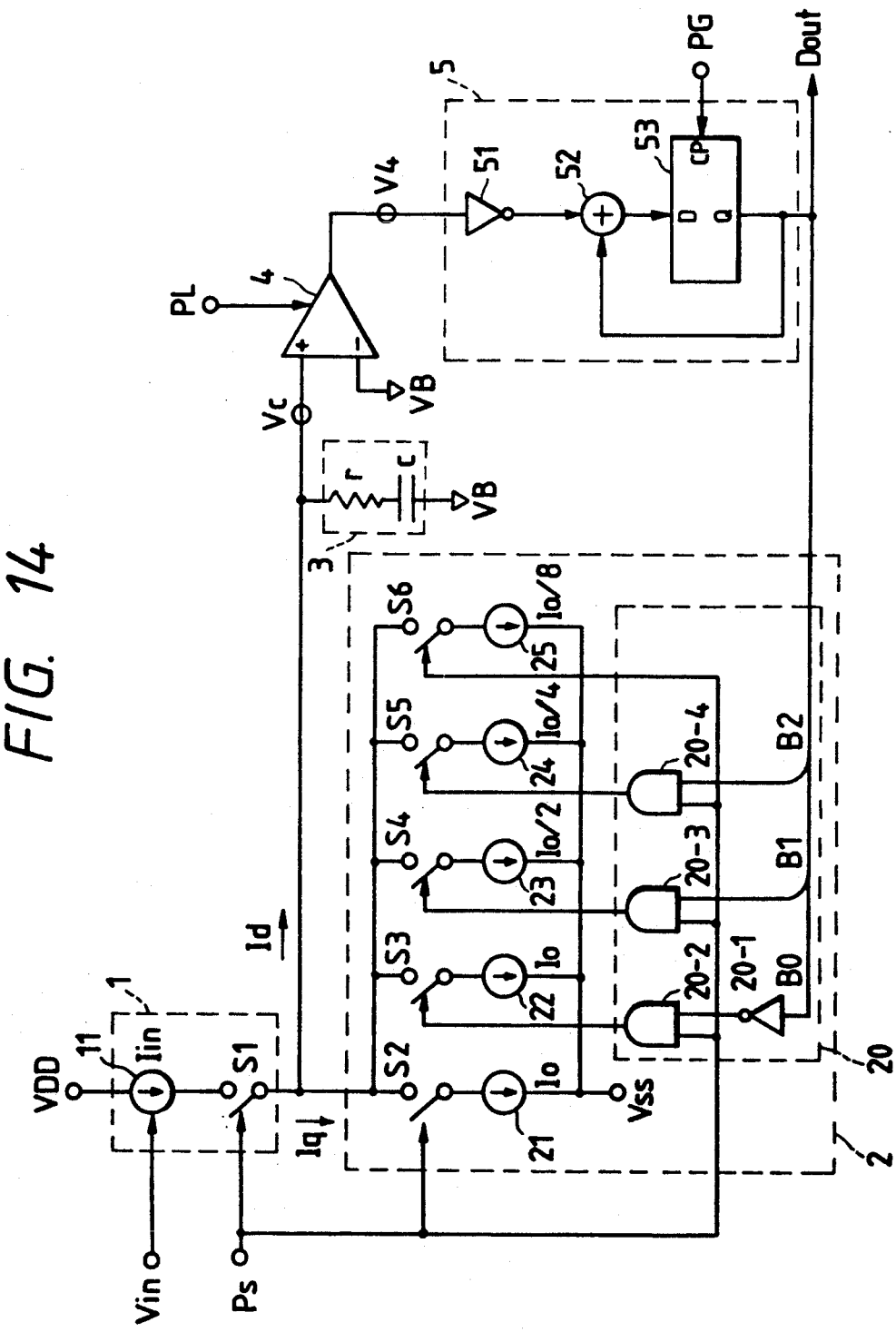
FIG. 14 is a circuit diagram showing a concrete embodiment of the interpolation-type A/D converter that is shown in FIG. 8.

FIG. 14 is a diagram which concretely shows a circuit that corresponds to the interpolation-type A/D converter according to the first embodiment of the present invention shown in FIG. 8, and wherein a voltage-to-current converter circuit 1 is constituted by a voltage-controlled current source 11 (current value Iin) connected to the first power source potential VDD that generates a current proportional to the input voltage signal Vin and a switch S1 that is controlled by a sampling pulse Ps. The current value Iin undergoes a change maintaining an amplitude of ±Isig (here, a maximum value of Isig is Io) with the direct current 2Io as a center point. The analog circuit 3 is constituted by a capacitor c having one end grounded to the dc potential VB and a resistor element r connected in series with the capacitor, and works as an analog integration circuit. The quantizing circuit 4 is constituted by a voltage comparator and a latch circuit (which is not particular diagrammed which amplifies the result of comparison up to a voltage level that is capable of operating the logic circuit and produces a logic output thereof that changes, for example, at the rising edge of the latch pulse PL. The digital circuit 5 is a digital integration circuit consisting of an inverter 51 that converts the output of the quantizing circuit 4 into the expression of the complement of 2 adapted to the integration operation, a parallel adder circuit 52, and a latch circuit 53.

Figures 15, 16:
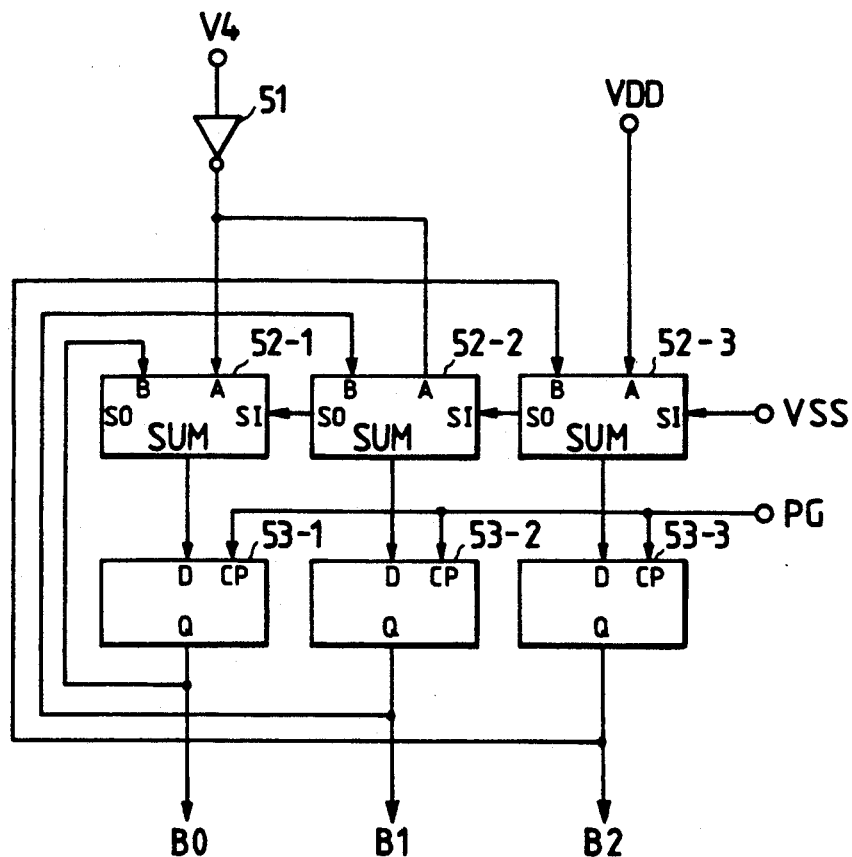
FIG. 15 is a circuit diagram of a digital integration circuit that is shown in FIG. 14.
FIG. 16 a diagram explaining the relationships between signals fed to a current switching circuit shown in FIG. 14 and feedback currents Iq.

FIG. 15 shows in further detail the constitution of the digital integration circuit 5 (of the case of three bits). Reverting to FIG. 14, the current switching circuit 2 is constituted by switches S2 and S6 controlled by the sampling pulses Ps, constant-current sources 21 (current value Io) and 25 (current value Io/8) provided between the above switches and a second power source potential Vss, a logic circuit 20 that corresponds to the three-bit constitution of the digital circuit 5, switches S3, S4 and S5 that are controlled by the output of the logic circuit 20 and that are connected in parallel with the switch 32 and the constant-current source 21, and constant-current circuits 22 (current value Io), 23 (current value Io/2) and 24 (current value Io/4). In the above constitution, the clock pulses Ps, PL and PG have the same timings as those shown in FIG. 13. Further, waveforms of the feedback current signal Iq, difference current Id and waveforms at the difference point Vc of the analog circuit 3 are the same as those shown in FIG. 9.

In FIGS. 14 and 15, the output V4 of the quantizing circuit 4 assumes the high logic level (hereinafter expressed as "1") when the voltage Vc of the analog integration circuit has a relation Vc>VB at the rising edge of the clock pulse PL, and assumes the low logic level (hereinafter expressed as "0") when Vc<VB. Therefore, the input to the digital adder circuit 52 or 52-1, 52-2, 52-3 becomes "001" or "111" successively depending upon the relations VC>VB and Vc<VB. As these signals are continuously or alternatingly input, the outputs (B0, B1, B2) of the digital integration circuit 5 produces eight different patterns as shown in FIG. 16 to form an output Dout of the A/D converter. The feedback current signal Iq is also output in amplitudes of eight levels (four levels on the positive side and four levels on the negative side) of FIG. 16 to correspond to the digital output patterns with 2Io as a center.

Figure 17:
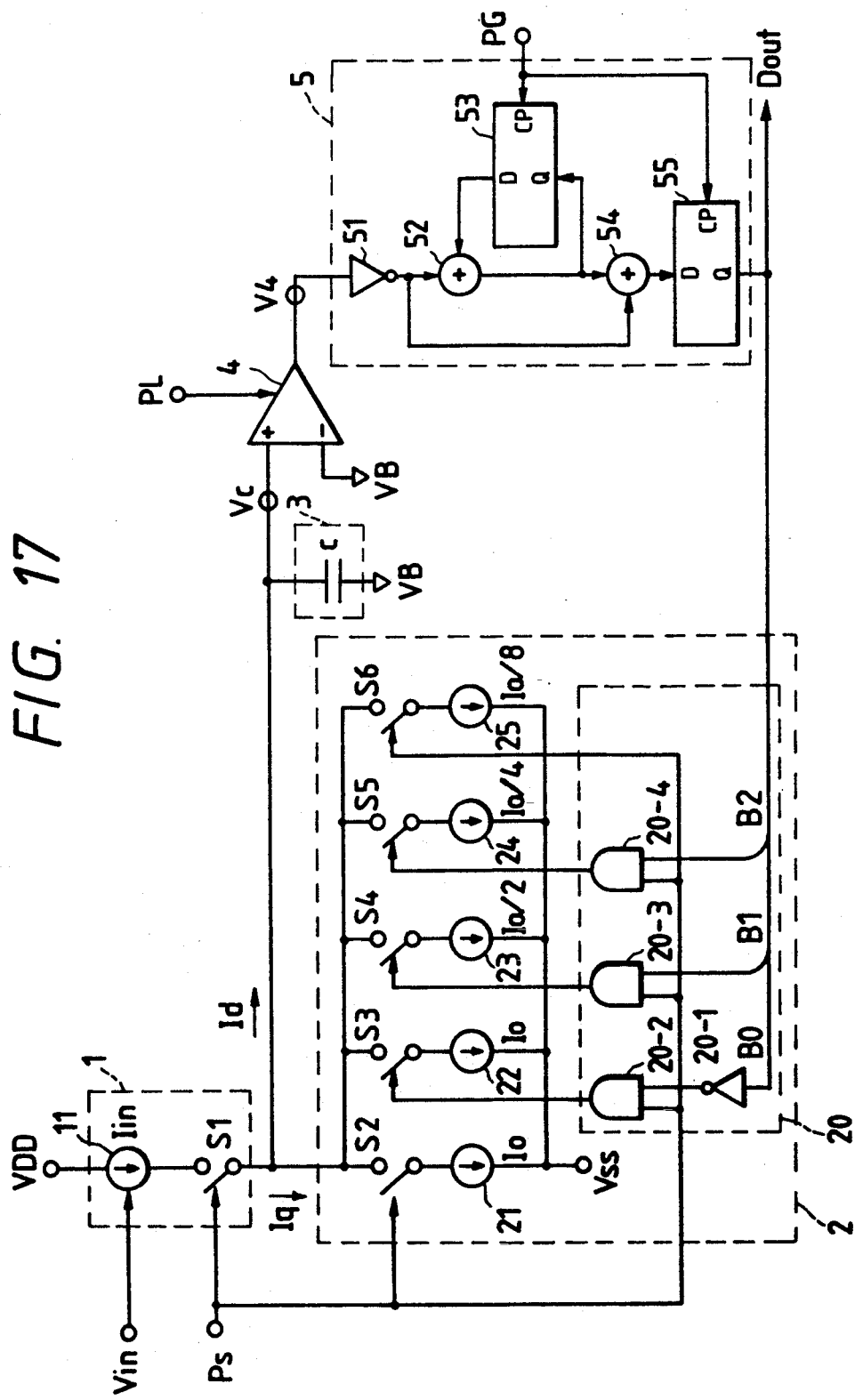
FIG. 17 is a circuit diagram showing a further concrete embodiment of the interpolation-type A/D converter that is shown in FIG. 10.

FIG. 17 is a diagram which concretely shows a circuit that corresponds to the interpolation-type A/D converter according to a second embodiment of the present invention shown in FIG. 10. This circuit is the same as the circuit of the first embodiment concretely shown in FIG. 14 except for the constitution of the analog integration circuit 3 and the digital integration circuit 5. The timings of the clock pulses Ps, PL, PG are the same as those shown in FIG. 10, and the waveforms of the feedback, current signal Iq, difference current Id and voltage at the difference point Vc of the analog circuit 3 are the same as those which are shown in FIG. 11. Here, the digital integration circuit 5 can be easily realized in the same manner as the one that was shown concretely and in detail in FIG. 15 relative to FIG. 14.

Though not described here in detail, it will be easily understood that the ΔM-type A/D converter of FIG. 4 is concretely realized if the analog circuit 3 is constituted by the resistor element only in the concrete circuit of the interpolation-type A/D converter of the first embodiment of the present invention shown in FIG. 14. The digital integration circuit 5 of the A/D converter can further be realized by using, for example, a bidirectional shift register circuit or an up-down counter in addition to the integration circuit explained above. Moreover, in addition to being independently constituted as described above, the A/D converters according to the present invention may be connected in many stages in cascade while using a voltage at the difference point as an input signal to the A/D converter of the next stage, in order to realize the A/D converter maintaining a high conversion accuracy.

Here, in order to realize the ΔΣ-type converter (FIG. 6) and the interpolation-type converter (FIGS. 8, 10, 12, 14 and 17) having the aforementioned analog integration circuit highly accurately and stably, it is necessary to set τ=cR which is the condition for holding the aforementioned equations 14, 20 and 24 to be equal to the time constant cR of the analog integration circuit, i.e., it is necessary to set the pulse width τ of the sampling pulse Ps to be equal to the time constant cR of the analog integration circuit. With the conventional semiconductor integrated circuit technology, however, this is difficult to realize without changing absolute values of the capacitor and the resistor element maintaining economy.

According to the present invention, therefore, the above-mentioned condition (τ=cR) is realized by the combination of a sampling pulse-forming circuit that consists of a reset circuit for discharging the electric charge of the integration capacitor with a voltage-to-current converter circuit, a switch and a capacitor that sample and integrate the current of the above converter circuit using clock pulses of the same frequency as the A/D converter, a voltage comparator circuit that compares the integrated voltage of the capacitor with a predetermined threshold value to generate an output of the logic level, and a logic circuit that generates a desired pulse width from the above clock pulses relying upon the logic output of the comparator circuit, thereby to cancel variations in the element values in the A/D converter by the pulse width.

Figure 18:
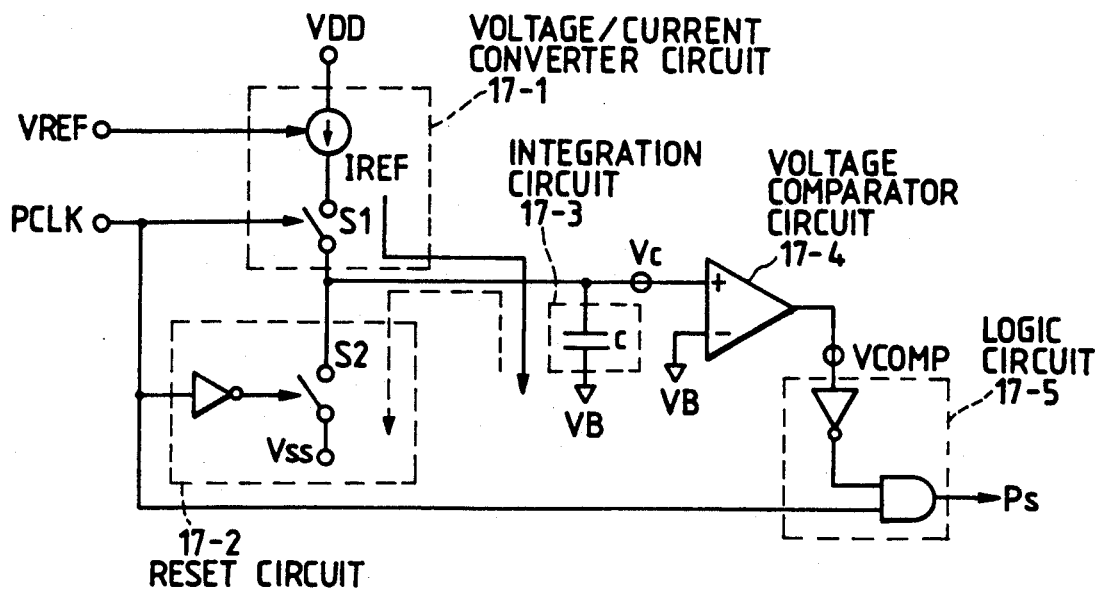
FIG. 18 is a circuit diagram of an embodiment of a sampling pulse-forming circuit.
Figure 19:
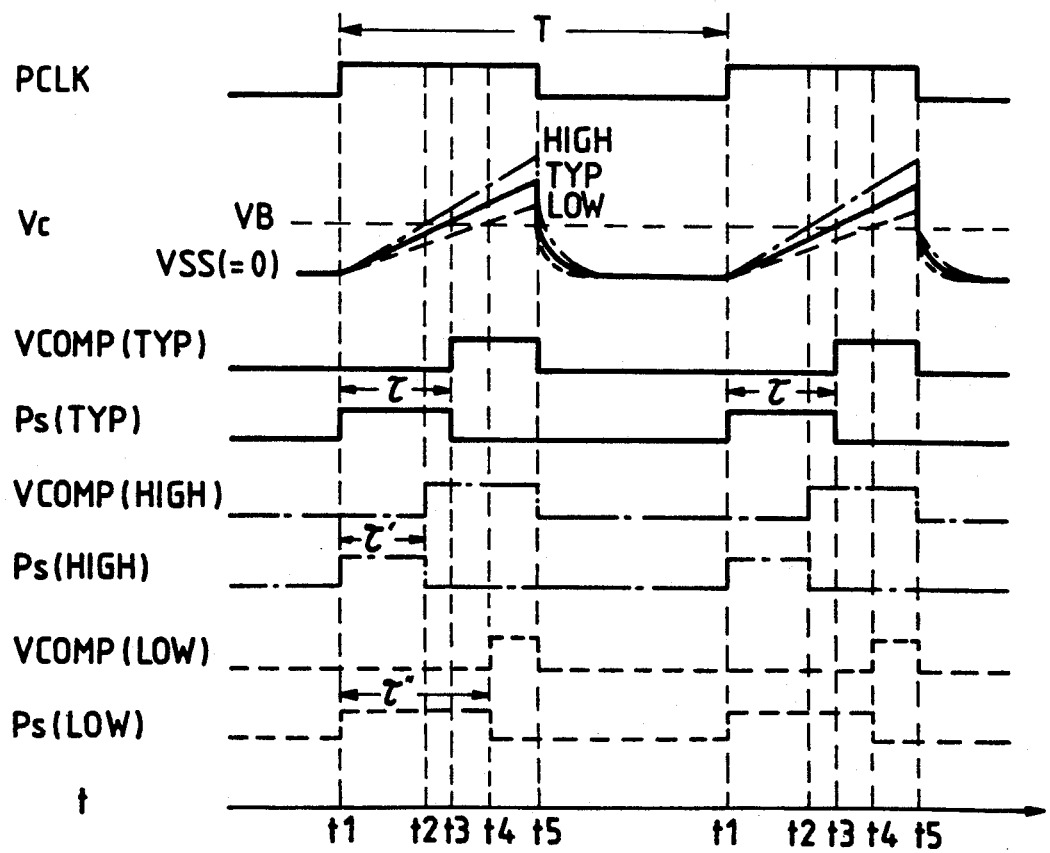
FIG. 19 is a diagram for explaining the operation of the sampling pulse-forming circuit that is shown in FIG. 18.

FIG. 18 shows a sampling pulse-forming circuit according to an embodiment of the present invention for achieving the aforementioned object, and FIG. 19 shows waveforms at each of the portions to explain the operation of FIG. 16. In FIG. 18, the voltage-to-current converter circuit 17-1 has the same circuit constitution as the one adapted to the aforementioned A/D converters, and is constituted by a voltage-controlled current source of which one end is connected to the first power source potential VDD and which has a conversion function between reference voltage VREF and current-source current IREF of 1/R (i.e., IREF=VREF/R), and a switch S1 which is controlled by clock pulses PCLK having a repetition period T. The reset circuit 17-2 is constituted by a switch S2 of which one end is connected to the second power source potential Vss and which is controlled by the, above clocks PCLK. The capacitor (having a capacitance c) that constitutes the integration circuit 17-3 is connected between the third power-source potential VB and the connection point of the switches S1, S2.

If now the clock pulse PCLK has the low logic level just before the time t=t1 as shown in FIG. 19, the switch S1 is turned off, the switch S2 is turned on, the potential Vc of the integration capacitor becomes equal to the second-power-source potential Vss (=0), and both the output VCOMP of the voltage comparator circuit 17-4 and the output Ps of the logic circuit 17-5 assume the low logic level. Next, as the clock pulse PCLK assumes the high logic level at the time G=t1, the output Ps of the logic circuit 17-5 changes into the high logic level and, at the same time, the switch S1 is turned on and the switch S2 is turned off. Therefore the current of the current source IREF flows into the integration capacitor as indicated by a solid line, and the potential Vc of the capacitor rises.

When the integrated voltage of the capacitor becomes greater than a threshold value (VB in this case) at a time t=t3, the output VCOMP of the voltage comparator circuit 17-4 changes to the high logic level, and the output Ps of the logic circuit 17-5 changes again to the low logic level. Next, when the clock pulse PCLK changes into the low logic level at a time t=t5, the switch S1 is turned off and the switch S2 is turned on, whereby the potential Vc of the integration capacitor is discharged to the second power source potential Vss (=0), and the initial condition is assumed; i.e., both the output VCOMP of the voltage comparator circuit 17-4 and the output Ps of the logic circuit 17-5 assume the low logic level.

The sampling pulses Ps obtained by the repetition of the above-mentioned operation have a pulse width $\tau$ that is expressed by the following equation 25. Therefore, if VREF=VB, it is possible to form sampling pulses Ps having a pulse width which is equal to the desired width $\tau=cR$, i.e., equal to the time constant of the analog integration circuit, and which remains stable irrespective of changes in the manufacturing conditions of the semiconductors and in the environment where the device is used. This will now be described with reference to FIG. 19.

$$\tau = c \cdot VB/IREF \quad \text{[Eq. 25]}$$
$$= cR \cdot VB/VREF$$

Between Vc and VCOMP of FIG. 19, a solid line represents a center value (denoted as TYP) of the above changing conditions. When the integration capacitor c is small or when the voltage-controlled current source has a small conversion coefficient R permitting the current IREF to increase (denoted as indicated by a dot-dash chain line. In this case, the pulse width $\tau'$ of the sampling pulses Ps (HIGH) becomes small in proportion to the above change. On the contrary, when the integration capacitor c is great or when the voltage-controlled current source has a large conversion coefficient R causing the current IREF to become small (denoted as LOW), the potential Vc of the integration capacitor becomes as denoted by a broken line. In this case, the pulse width $\tau''$ of the sampling pulses Ps (LOW) becomes broad in proportion to the above change.

For instance, when a sampling frequency of 1.024 MHz is employed for the A/D converters of the present invention, the period of the clock pulses PCLK becomes T≈976 ns in FIGS. 18 and 19. Therefore, if the duty ratio is 50%, a maximum charging time for the capacitor c of FIG. 18 becomes T/2=488 ns. To simplify the description, let it now be presumed that there is no change in the conversion coefficient R of the voltage-to-current converter circuit 17-1 and the capacitor c varies by a maximum of ±30%. Then, it is necessary to set the center value c of the capacitor and the conversion coefficient R to satisfy the condition $\tau''=1.3cR<488$ ns, where $\tau''$ denotes a maximum pulse width caused by a change in the sampling pulses Ps. That is, R≈37.5 kiloohms if c=10 pF and r≈3.75 kiloohms if c=100 pF. In this case, the pulse width at the center of charge in the sampling pulses Ps is $\tau \approx 375$ ns, and a minimum pulse width caused by the change is $\pi'$ (=0.7 $\tau$)≈263 ns.

Therefore, the sampling pulses Ps formed in FIG. 18 have a pulse width which varies in proportion to the change in the above conditions. By forming the sampling pulse-forming circuit in an integrated manner on the same semiconductor substrate as the various A/D converters, it is possible to maintain stable the operation of the A/D converters.

Figure 20:
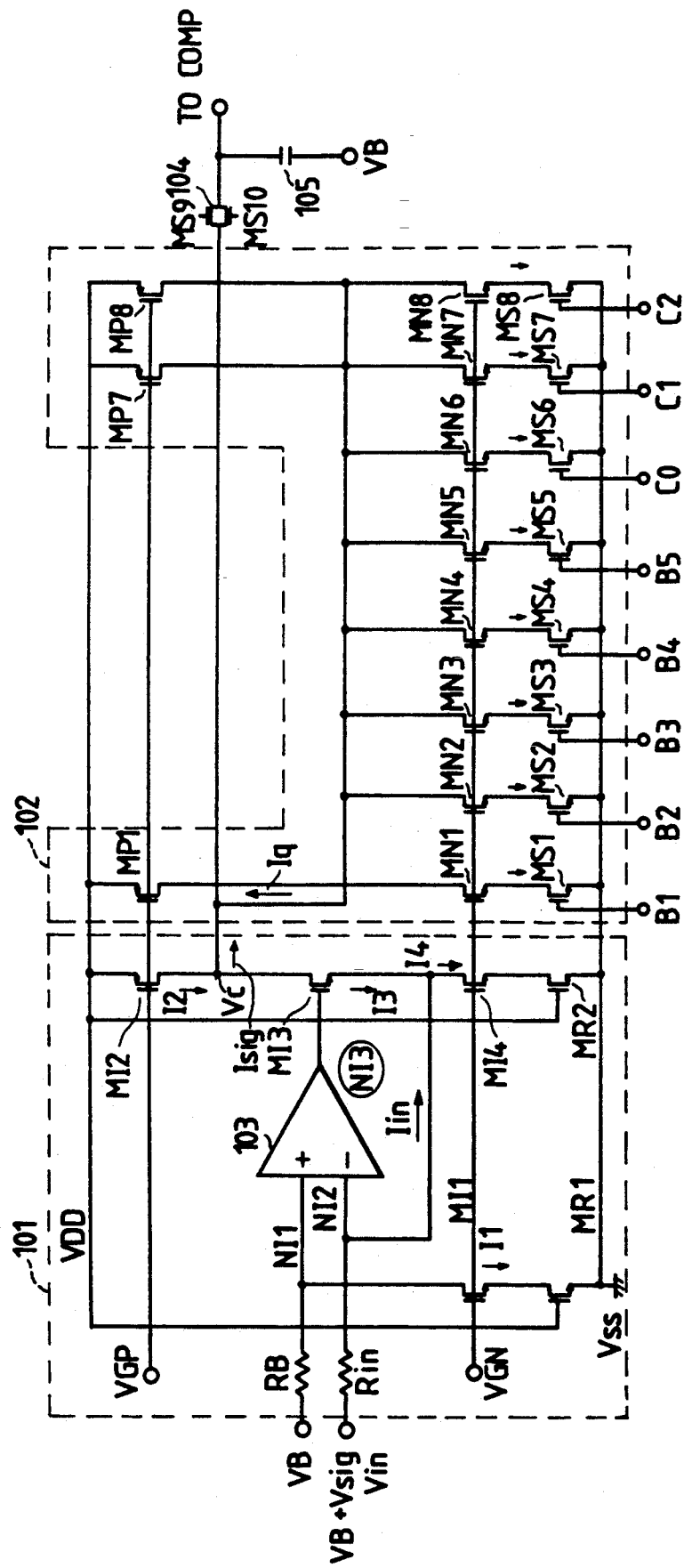
FIG. 20 is a diagram explaining a voltage-to-current converter circuit and a local D/A converter circuit included in the A/D converter circuit according to a still further embodiment of the present invention.

FIG. 20 illustrates a further embodiment that corresponds to the A/D converter of the interpolation-type 2 among the A/d converters of the present invention. In FIG. 20, which particularly shows the analog circuit portion only, reference numeral 101 denotes an input voltage-to-current converter circuit having a function for shifting the dc level of the input analog voltage signals, 102 denotes a current switching circuit for a local D/A converter having a 5-bit constitution inclusive of polarity, 104 denotes a switch for sampling the difference in the output currents of the input voltage-to-current converter circuit 101 and the current switching circuit 102 for the local D/A converter, and reference numeral 105 denotes an integration capacitor whose one end is grounded to the internally generated dc potential.

To the input terminal Vin is applied an input analog voltage signal Vsig that is superposed on the dc bias voltage VB that is internally generated to carry out the operation on a single power source. The input analog voltage signal Vsig is then fed to an inverted input terminal (node NI2) of an operational amplifier 103 via a resistor element Rin (having a resistance Rin). A bias voltage VB is applied to a dc bias application terminal VB and is then fed to a non-inverted input terminal (node NI1) of the operational amplifier 103 via a resistor element RB (having a resistance RB). To the node NI1 are connected an N-channel MOS transistor MI1 whose gate electrode is served with a bias voltage VGN and an N-channel MOS transistor MR1 which is connected in series between the transistor MI1 and the ground potential Vss and of which the gate electrode is served with a positive power source voltage VDD. To the output of the operational amplifier 103 is connected the gate electrode of an N-channel MOS transistor MI3 whose source electrode is connected to the inverted input terminal (node NI2) of the operational amplifier 103. To the drain electrode and source electrode of the above transistor MI3 are connected the drain electrodes of a P-channel transistor MI2 and an N-channel MOS transistor MI4 whose gate electrodes are served with bias voltages VGP and VGN, respectively. Furthermore, an N-channel MOS transistor MR2 whose gate electrode is served with the positive power source voltage VDD is connected between the source electrode of the transistor MI4 and the ground potential Vss.

Here, the transistors MR1 and MR2 are both turned on, and constant currents I1, I2 and I4 (here, I4=I2+IB, and IB is a constant current that will be described later and that corresponds to the current Iin when Vsig=0) are set to flow into the transistors MI1, MI2 and MI4. As a result, though there is no particular limitation, the potential of, for example, the node NI1 is set to the dc potential VB/2, and the operational amplifier circuit 103 operates on this voltage as an imaginary ground potential. Here, the potential VB/2 at the node NI1 may be directly applied from a separate current source without using resistor element RB or transistors MI1, MR1.

In the above input voltage-to-current converter circuit 101, the electric current Iin that flows into the resistor element Rin is given by the following equation 26:

$$Iin = (VB + Vsig - VB/2)/Rin \quad \text{[Eq. 26]}$$
$$= (VB/2Rin) + Vsig/Rin$$
$$= IB + Isig$$

where IB=VB/2Rin, Isig=Vsig/Rin.

As an example, if a maximum amplitude of the input voltage signal is Vsig=±VB/2, then Isig=±IB. On the other hand, constant currents flow into the transistors MI2 and MI4 irrespective of the value of input signal Vsig. Therefore, when Vsig=+VB/2 (case 1), Iin becomes equal to 2IB and at this moment, the current I3 that flows through the transistor MI3 becomes I3=I2−IB. When the switch 104 is turned on, accordingly, the integration capacitor 105 is electrically charged in the direction of power source potential VDD, due to a difference current IB between I2 and I3.

Next, when Vsig=0 (case 2), Iin is equal to IB. Therefore, I3=I2, the difference current becomes zero between I2 and I3, and the integration capacitor 105 is not electrically charged.

Further, when Vsig=−VB/2 (case 3), Iin becomes zero and, hence, I3=I2+I3. In this case, the difference current IB between I2 and I3 flows in a direction opposite to the case 1. When the switch 104 is turned on, therefore, the integration capacitor 105 is integrated in the direction of ground potential.

In the above operation, the level at the node NI1 is set to, for example, VB/2 which is lower than the analog ground potential VB, and the source potential of the transistor MI3 becomes lower than the voltage VB. It therefore becomes possible to bias Vc to be close to VB, enabling the comparator 106 to exhibit a maximum operation sensitivity with the analog ground potential VB as a reference. Here, if the level at the node NI1 is set to be equal to the level of the analog ground potential VB, the source potential of the transistor MI3 becomes equal to VB. When the transistor MI3 is turned on, therefore, the level of Vc becomes higher than the analog ground potential VB, and the comparator 106 exhibits a decreased sensitivity in the operation of comparison. Even if it is attempted to avoid this, however, difficulty is involved in selecting a voltage other than the voltage VB as a reference for the comparator 106, and a special circuit is required as well.

The current switching circuit 102 that works as a local D/A converter circuit is provided in parallel with the transistor MI2, and is constituted by p-Channel transistors MP1, MP7 and MP8 which permit the flow of constant currents 16Io, Io and Io upon receipt of the bias voltage VGP through the gate electrodes, N-channel transistors MN1 to MN8, whose drain electrodes are connected in parallel with the node Vc, and N-channel transistors MS1 to MS8 connected between the source electrodes of the transistors MN1 to MN8 and the ground potential Vss. When the transistors MS1 to MS8 are turned on by a control signal, the transistors MN1 to MN8 permit the flow of constant currents shown in FIG. 21 upon receipt of the bias voltage VGN through the gate electrodes thereof.

That is, constant currents 16Io, 8Io, 4Io, 2Io and Io of binary loads flow into the transistors MN1 to MN5 when the transistors MS1 to MS5 are turned on by the control signals B1 corresponding to the most significant bit that usually represents polarity data) to B5 (corresponding to the least significant bit) formed from the digital signals as the results of A/D conversion applied to the gate electrodes thereof.

Into the transistors MN6 and MS6 flows a constant current Io/2 due clock pulses CO in synchronism with the switching operations of the transistors MN1 to MN5 and the transistors MS1 to MS5 effected by the control signals B1 to B5.

The transistors MN7 and MS7 constitute a current switching circuit that works to maintain stable operation when there exist secondary or higher-order integration elements in a loop that constitutes the A/D converter as will be described below, and work to switch ±Io in combination with the constant current Io of the transistor MP7 depending upon the output of the voltage comparator that determines the positive or negative sign of the signal amplitude voltage of the integration capacitor 105.

The transistors MN8 and MS8 constitute a current switching circuit which applies a dither signal of a predetermined period, which is so set as to flow a constant current 2Io, and which alternatingly generates ±Io in combination with the constant current Io of the transistor MP8. This is effective in improving the minimum decomposition function, but the application of the dither signal pertains to the design requirement and there is imposed no particular limitation on the current value. Furthermore, provision of this circuit does not impose any limitation on the present invention. Therefore, dealing with the dither signal is not mentioned in the following description. The dither signal has been described in IEEE Journal of Solid-State Circuits, SC-14, pp. 25–37, February, 1979.

FIG. 21 shows relationships between the feedback currents Iq supplied from the local D/A converter 102 and the switch control signals, wherein numeral 1 represents the high logic level and 0 represents the low logic level.

In FIG. 20, though there is no particular limitation, the sampling switch 104 is constituted by a P-channel transistor MS9 and an N-channel transistor MS10 that are connected in parallel, and is turned on and off by the sampling pulses supplied from the pulse-forming circuit illustrated in FIG. 18. When the sampling switch 104 is turned on, the integration capacitor 105 integrates the difference current Id between the input current signal Isig and the feedback signal current Iq from the local D/A converter.

In the above description, the P-channel transistor MP1 may be constituted by connecting, in parallel, sixteen transistors having the same size as the transistor MP7. Moreover, it needs not be pointed out that MP1, MP7 and MP8 can be constituted by a single transistor. When these transistors are separately constituted, furthermore, the voltage applied to the gates may have a value different from the above VGP to meet the transistor sizes. Similarly, furthermore, the current switching circuit 102 serving as the local D/A converter circuit was described to be constituted by the transistors MN1 to MN8 having current values of binary loads. Here, however, MN5 and MS5 may each be constituted by connecting, in parallel, two transistors of the same size as MN6 and MS6, MN4 and MS4 may each be constituted by connecting, in parallel four transistors of the same size as MN6 an MS6, and MN1 and MS1 may each be constituted by connecting, in parallel, 32 transistors of the same size as MN6 and MS6.

Figure 22:
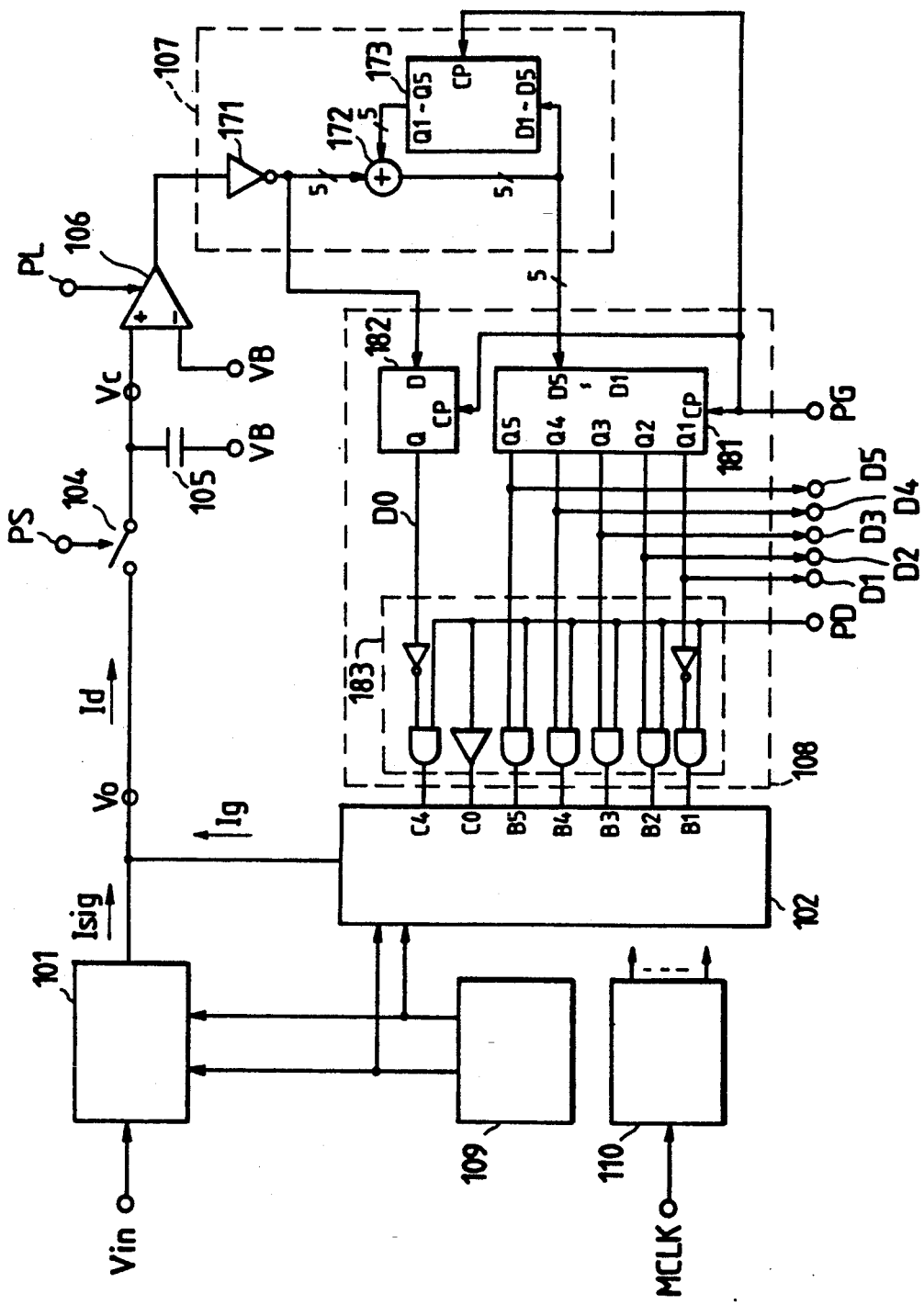
FIG. 22 is a diagram of an over-sampling A/D converter according to an embodiment of the present invention to which are adapted the input voltage-to-current converter circuit and the local D/A converter circuit of FIG. 20.

FIG. 22 shows the whole constitution of the interpolation-type over-sampling A/D converter according to the present invention realized by using the input voltage-to-current converter circuit 101, current switching circuit 102 for local D/A conversion, sampling switch 104, and integration capacitor 105 that are shown in FIG. 20. In FIG. 22, reference numeral 106 denotes a voltage comparator having a latching function, 107 denotes a digital integration circuit, 108 denotes a logic interface circuit, 109 denotes a reference voltage-generating circuit, and 110 denotes a pulse circuit that generates control pulses necessary for the operations by dividing the frequency based on the master clocks MCLK input from an external unit.

Figure 23:
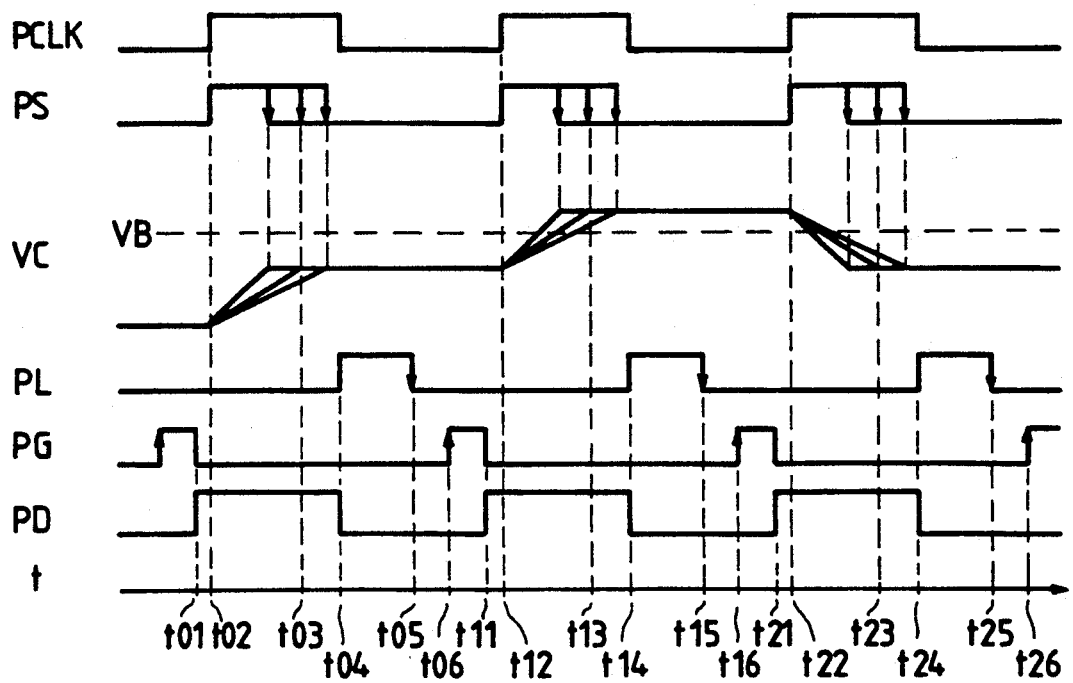
FIG. 23 is a diagram for explaining the operation of the A/D converter that is shown in FIG. 22.

FIG. 23 shows operation timings and waveforms at each of the portions of FIG. 22. In FIG. 23, when the control pulse PD assumes the high logic level at a time $t=t_{01}$, the results D1 to D5 of A/D conversion of sample values before the input signal and the polarity data D0 of the integration capacitor 105 are applied to the current switching circuit 102 for the local D/A conversion, and a corresponding feedback current Iq is output from the current switch 102 for the local D/A conversion. Next, when the sampling pulse PS assumes the high logic level at a time $t=t_{02}$, the switch 104 is turned on, and the integration capacitor 105 is electrically charged by a difference current Id between the signal current Isig output from the input voltage-to-current converter circuit 101 and the feedback current Iq. If the voltage of the upper electrode of the integration capacitor 105 is lower than the internally generated dc ground potential VB and if Isig>Iq or Id>0, then the voltage of the upper electrode of the integration capacitor 105 rises as shown. Here, the sampling pulse PS has a width which varies in proportion to a change in the charging time constant caused by changes in the capacitance, resistance and threshold voltage of transistors during the production or changes in the power source voltage and ambient temperature, and has the rising edge, (time $t=t_{02}$) of a basic pulse PCLK as a reference.

Though there is no particular limitation, the sampling pulse PS can be formed by a circuit that is shown in FIG. 17. That is, as shown in FIG. 23, when the manufactured value of the integration capacitor 105 becomes smaller than the central value or when the current of the constant current source becomes great, the integration time constant becomes small and the capacitor is quickly charged, and the sampling pulse PS, at this moment, has a narrow pulse width. When the integration capacitor becomes great and the current of the constant current source becomes small, on the other hand, the integration time constant becomes great and the capacitor is slowly charged. In this case, the sampling pulse PS has a broadened width. Therefore, the potential Vc at the upper electrode of the integration capacitor 105 can be stabilized to become equal to the manufactured center value.

Next, after the sampling is finished at a time $t=t_{03}$, the voltage comparator 106 having a latching function commences the operation of comparison just as the pulse PD assumes the low logic level at $t=t_{04}$ and is latched by the breaking edge of the pulse PL at a time $t=t_{05}$. At a time $t=t_{04}$ in FIG. 23, the voltage comparator produces an output of the low logic level (0). As a result, the output is converted into a 5-bit signal (11111) of the notation of a complement of 2 for being calculated in the digital integration circuit 107. This conversion is obtained by inverting the output level of the comparator through an inverter 171, to use the inverted output as the most significant 4-bit signal and, at the same time, adding 1 thereto in a fixed manner as a signal of the fifth bit. The above 5-bit signal that corresponds to −1 in terms of an analog signal level is added by a full adder 172 to the result of up to the previous time stored n a parallel latch 173 of the 5-bit constitution, and the result is latched by the parallel latch 173 and by a 5-bit parallel latch 181 in the logic interface circuit 108 at the rising edge of pulse PL at a time $t=t_{06}$.

In this embodiment the outputs D1 to D5 of the 181 are the results of A/D conversion. Therefore, the latch 181 is provided in addition to the latch 173 to maintain interchangeability of interface relative to the reducing filter that is not shown. However, the latches 173 and 181 may be commonly used since they store quite the same data.

At the same time, the output of the inverter 171 is stored in the latch 182. The output of the latch 181 and the output of the latch 182 are supplied to the current switching circuit 102 via a logic gate 183.

Next, as the pulse PD assumes the high logic level at a time $t=t_{11}$, the new results D1 to D5 of A/D conversion and the polarity data D0 of the integration capacitor 105 are applied to the current switching circuit 102 for local D/A conversion, which then outputs a corresponding feedback current Iq. At this moment, the feedback current Iq becomes greater by 2Io than the previous current.

Hereinafter, the operation is carried out in the same manner as described above, but the output of the voltage comparator 106 assumes the high logic level at a time $t=t_{15}$. In this case, the input data of the full adder 172 in the digital integrator 107 consists of a 5-bit signal (00001) of the notation of a complement of 2 that corresponds to an analog value +1 and, as a result, the feedback current Iq output at a time $t=t_{21}$ becomes smaller by 2Io than that of the previous time.

In the above description, the resistance elements RB, Rin were used in the voltage-to-current converter circuit 101 of FIG. 20 which, however, can also be realized even by using equivalent resistances such as switched capacitors in their place. In FIG. 22, furthermore, it is further allowable to provide a plurality of voltage comparators 106 in parallel to determine not only the polarity of the integrated voltage but also the voltage level at the same time, in order to quantize a plurality of bits and to suitably vary the feedback signal depending on the level thereof, such that the conversion accuracy can be further improved. Similarly, furthermore, it is allowable to provide a plurality of voltage comparators 106 in parallel to quantize a plurality of bits, and to directly drive the local D/A converter circuit 102 using the output signal thereof, eliminating the digital integration circuit and the circuit for stabilizing the loop. In this case, the device is of the aforementioned $\Delta\Sigma$-type.

Figure 24:
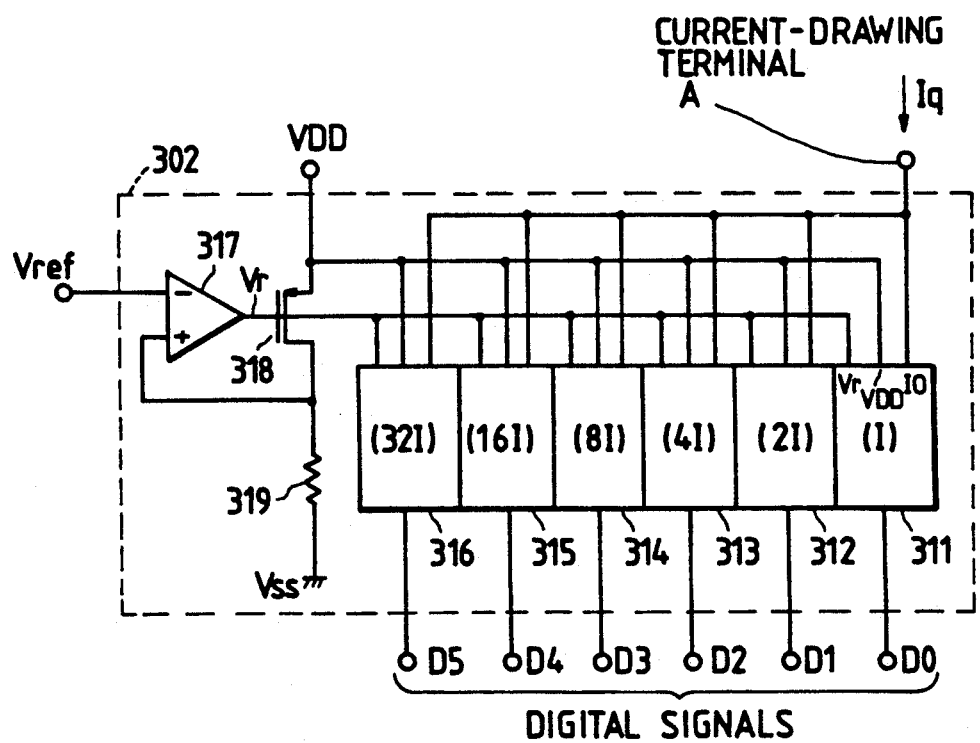
FIG. 24 is a circuit diagram showing an embodiment of the current switching circuit according to the present invention.

FIG. 24 shows another embodiment of the current switching circuit adapted to the A/D converter of the above-mentioned current integration type. The current switching circuit 302 shown in FIG. 24 has a current-drawing terminal A as an output terminal coupled to the output point of the voltage-to-current converter circuit, and further has circuit units 311 to 316 that are commonly connected to the terminal A and that are capable of flowing currents I, 2I, 4I, 8I, 16I and 32I that are weighed by the power of 2, respectively. The circuit units 311 to 316 are commonly served with, for example, the power source voltage VDD of the high-level side and the bias voltage Vr, as well as bits corresponding to the digital signals. In this embodiment, the digital signals are denoted by D0 to D5, and the corresponding bits are applied to the circuit units 311 to 316.

Though there is no particular limitation, the bias voltage Vr is output from the operational amplifier 317 that receives the reference voltage Vref through its inverted input terminal. Here, the output of the operational amplifier 317 is coupled to the gate electrode of the P-channel MOSFET 318 whose drain electrode is coupled to the non-inverted input terminal thereby to constitute a negative feedback circuit. That is, the output voltage Vr of the operational amplifier 317 is determined as a current, that is determined by the reference voltage Vref and the resistance element 319, flows into the MOSFET 318 and, at this moment, the drain voltage of the MOSFET 318 is set to be equal to the reference voltage Vref.

Figure 25:
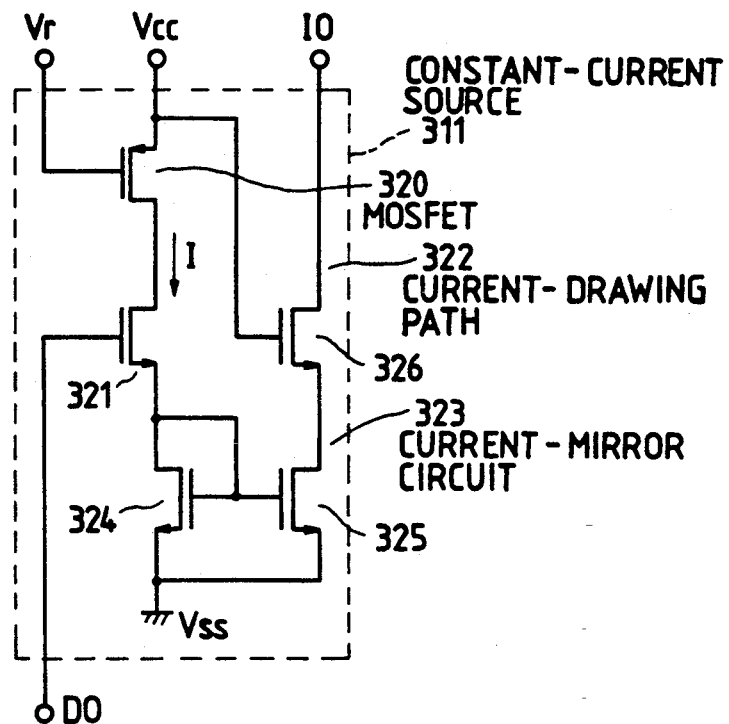
FIG. 25 is a circuit diagram of a current-drawing unit cell which is applied to the current switching circuit of FIG. 24.

FIG. 25 shows an example of the circuit unit 311. In the circuit unit 311, reference numeral 320 denotes a P-channel constant-current source MOSFET that receives the bias voltage Vr through the gate electrode thereof, 321 denotes an N-channel switching MOSFET that is connected in series with the constant-current source MOSFET that performs the switching operation upon receiving a bit D0 of the digital signal through the gate electrode thereof, 322 denotes a current-drawing path that serves as a current output path commonly connected to the current-drawing terminal A, and a current that flows through the constant-current source MOSFET 320 and the switching MOSFET 321 is reflected by the current-drawing path 322 via a current mirror circuit 323. The current mirror circuit 323 includes a pair of MOSFETs 324 and 325 whose gates are commonly connected together, the one MOSFET 324 assuming the so-called diode-connected form in which the gate electrode and the drain electrode are coupled together. Further reference numeral 326 denotes an N-channel dummy MOSFET that is arranged in the current-drawing path 322 to correspond to the switching MOSFET 321.

In the circuit unit 311, the operation condition of the constant-current source MOSFET 320 is equal to the operation condition of the MOSFET 318, and the potential at the node where the MOSFETs 320 and 321 are coupled together is set to be equal to the reference voltage Vref. Therefore, the constant-current source MOSFET 320 permits the flow of current I depending upon its size.

In this embodiment, the circuit unit 311 is grasped as a current-drawing unit cell that works as a current output unit cell. The circuit units 312 to 316 are constituted by the circuit units 311 that are arranged in parallel in numbers of the power of 2 depending upon the amounts of the currents that are to flow, and the switching MOSFETs 321 included in the same unit are commonly switched by the same bit of the digital signal. For instance, the circuit unit 312 capable of flowing a current 2I includes two circuit units 311, and the two switching MOSFETs 321 included therein are switched by a bit D1. Here, the circuit units may be constituted in a manner that the constant-current source MOSFETs have a relationship of the power of 2 in their sizes. In this case, however, error should not develop in the sizes of the MOSFETs to a degree that cannot be neglected; otherwise, error develops in the amounts of current in proportion to the error in the sizes.

Depending upon the A/D conversion operation, the current Iq that is drawn in through the current switching circuit 302 varies over a range of from a minimum of I to a maximum of 63I. In this case, a reflected current of the current flowing into the constant-current source MOSFET 320 is permitted to flow, via the current mirror circuit 323, into the current-drawing paths 322 that are commonly connected to the current-drawing terminal A. Therefore, the conductance of the constant-current source MOSFET 320 remains substantially unchanged irrespective of the current that is drawn from the current-drawing terminal A. With the current that is drawn from the current-drawing terminal A being controlled by the digital signals that have various values, therefore, the output current is allowed to possess highly accurate linear characteristics that vary depending upon the digital signals.

Figure 26:
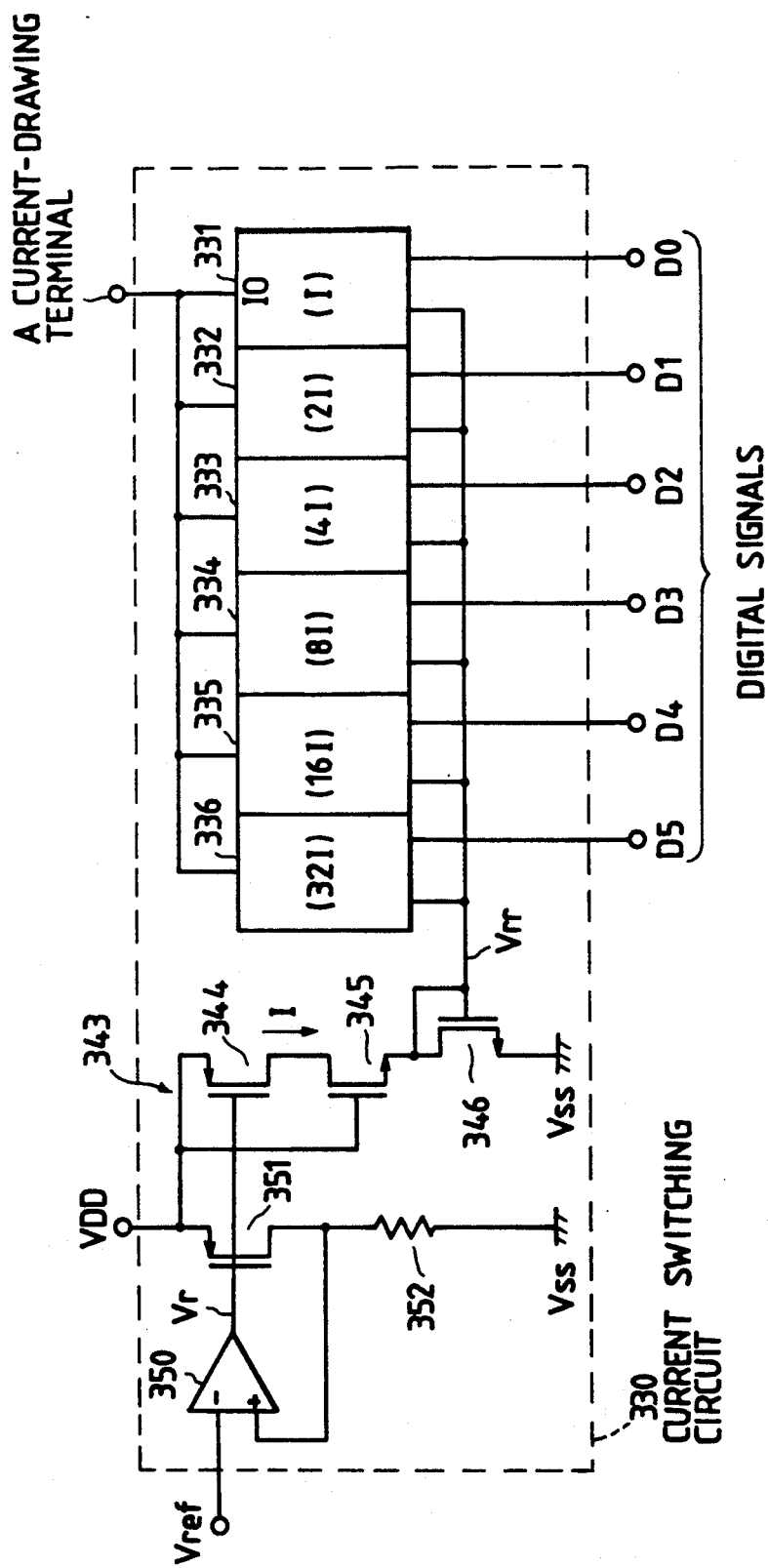
FIG. 26 is a circuit diagram of another embodiment of the current switching circuit according to the present invention.

FIG. 26 shows a further embodiment of the current switching circuit. The current switching circuit 330 shown in FIG. 26 has a current-drawing terminal A coupled to the output point of the voltage-to-current converter circuit, and has circuit units 331 to 336 that are commonly connected to the terminal A and that are capable of flowing currents I, 2I, 4I, 8I, 16I and 32I that are weighed by the power of 2, each of the circuit units 331 to 336 being served with corresponding bits of the digital signals. The digital signals are 6-bit signals D0 to D5 like those of the aforementioned embodiment, and the circuit units 331 to 336 are served with corresponding bits.

Figure 27:
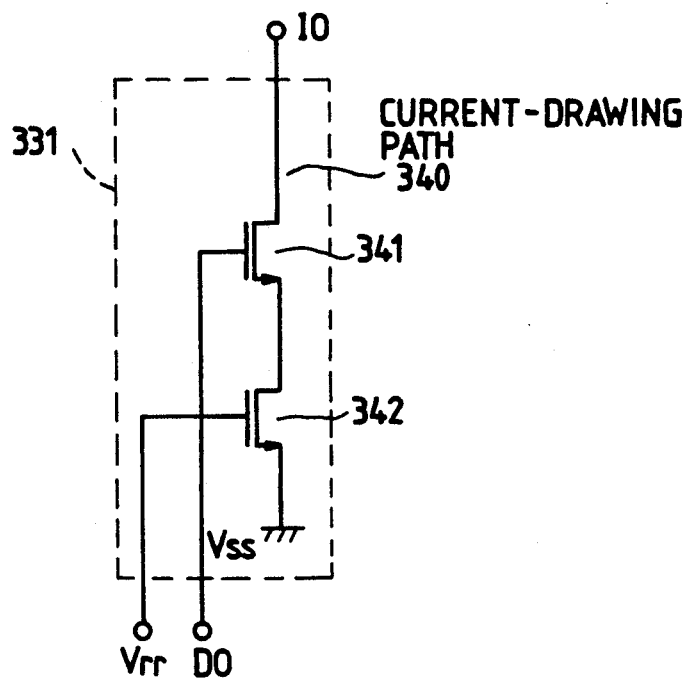
FIG. 27 is a circuit diagram of a current-drawing unit cell which is applied to the current switching circuit of FIG. 26.

In this embodiment, the circuit unit 331 is constituted as shown in FIG. 27 by connecting an N-channel switching MOSFET 341 that is controlled upon receiving a bit D0 of the digital signal through the gate electrode thereof and an N-channel MOSFET 342 of the current mirror circuit in series with the current-drawing path 340 that is a current output path commonly connected to the current-drawing terminal A.

In this embodiment, the circuit unit 331 is grasped as a current-drawing unit cell that is a current output unit cell, the circuit units 332 to 336 are constituted by arranging in parallel the circuit units 331 in numbers of the power of 2 depending upon the amounts of currents to flow, and the switching MOSFETs 341 included in the same circuit units are commonly controlled by the same bit of the digital signals. For instance, the circuit unit 332 that is capable of flowing a current 2I includes two circuit units 331, and two switching MOSFETs 341 included therein are commonly controlled by the bit D1.

In this embodiment, the constant-current source circuit 343 shown in FIG. 26 is commonly utilized for the circuit units 331 to 336. That is, the constant-current source circuit 343 is constituted by a P-channel constant-current source MOSFET 344 that receives a bias voltage Vr through the gate electrode thereof and an N-channel dummy MOSFET 345 that are connected in series, and by a diode-connected N-channel MOSFET 346 that constitutes a current mirror circuit to reflect a current flowing into the MOSFETs 344 and 345 in the current-drawing path 340 of the circuit units 331 to 336. The gate electrode of the MOSFET 346 is commonly connected to the gate electrodes of the MOSFETs 342 included in the circuit units 331 to 336 thereby to constitute a current mirror circuit.

Like the aforementioned embodiment, the bias voltage Vr is formed by the output of the operational amplifier 350 that receives a reference voltage Vref through the inverted input terminal thereof. The output of the operational amplifier 350 is coupled to the gate electrode of the P-channel MOSFET 351, and the drain electrode of the MOSFET 351 is coupled to the non-inverted input terminal to constitute a negative feedback circuit. That is, the output voltage Vr of the operational amplifier 350 is determined as a current that is determined by the reference voltage Vref and the resistor element 352 flows through the MOSFET 351 and, at this moment, the drain voltage of the MOSFET 351 is set to be equal to the reference voltage Vref. Therefore, the operation condition of the constant-current source MOSFET 344 becomes equal to the operation condition of the MOSFET 351, the potential at the node where the MOSFETs 344 and 345 are coupled together becomes equal to the reference voltage Vref, and the constant-current source MOSFET 344 permits a current I to flow depending upon its size.

At this moment as the MOSFET 341 is turned on in the current-drawing unit cell such as the one shown in FIG. 27, a current I flows into the current-drawing path 340 due to a set of current mirror circuits constituted by the MOSFET 46 and the MOSFET 342. The current flowing into the current-drawing unit cell has the same value I irrespective of how many MOSFETs 341 are turned on by a value of the digital signal. That is, a relationship between a current-drawing unit cell and a constant-current source circuit 343 is equivalent to a circuit that is shown in FIG. 25.

When the current switching circuit 330 is applied to the A/D converter of the type of current integration, the drawn current Iq that flows into the current switching circuit 330 varies from a minimum of I to a maximum of 63I depending upon the A/D conversion operation. At this moment, a reflected current of the current I that flows into the constant-current source circuit 343 flows, via a current mirror circuit, into the current-drawing paths 340 that are commonly connected to the current-drawing terminal A. Therefore, there is no change in the conductance of the constant-current source MOSFET 344 that constitutes the constant-current source circuit 343 irrespective of the magnitude of the current drawn from the current-drawing terminal A.

With the current that is drawn from the current terminal A being controlled by the digital signals that have various values, therefore, the current that is drawn exhibits highly accurate linear characteristics relative to the values of the digital signals. In the constitution of FIG. 26, in particular, the constant-current source circuit 343 works commonly for the circuit units 331 to 336, and the transistors are used in a number smaller than that of the constitution of FIG. 24 to obtain similar effects.

According to the above-mentioned current-switching circuits 302 and 330, a reflected current of the current flowing into the constant-current source circuit flows, via a current mirror circuit, into the current-drawing paths 322 (340) that are commonly connected to the current-drawing terminal A which is the output terminal, and the reflected currents are added up at the current-drawing terminal A. Therefore, there is no substantial change in the conductance of the constant-current source transistor 320 (344) that constitutes the constant-current source circuit irrespective of the magnitude of the current at the current-drawing terminal A. Therefore, the output current at the current-drawing terminal A that is controlled by the digital signals having various values is allowed to possess highly accurate linear characteristics that vary depending upon the values of the digital signals.

Furthermore, the currents weighed by the power of 2 are permitted to flow depending upon the digital signals by arranging in parallel required numbers of current-drawing unit cells 311 (331) as shown in FIGS. 25 and 27. Therefore, the currents need not be weighed based on the sizes of the constant-current source transistors, making it possible to make uniform the size of the MOSFETs arranged in the constant-current source circuits and in the current-drawing paths and, hence, to further reduce error in the output current for the digital signals.

When employed as a local D/A converter circuit in the over-sampling A/D converter of the type of analog integration, the output current of the current switching circuit forms a difference current from a current signal that is converted through the input voltage-to-current conversion means, and the value of the difference current is highly accurately controlled depending upon the value of the digital signal, making it possible to guarantee high conversion accuracy of the over-sampling A/D converter.

Figure 28:
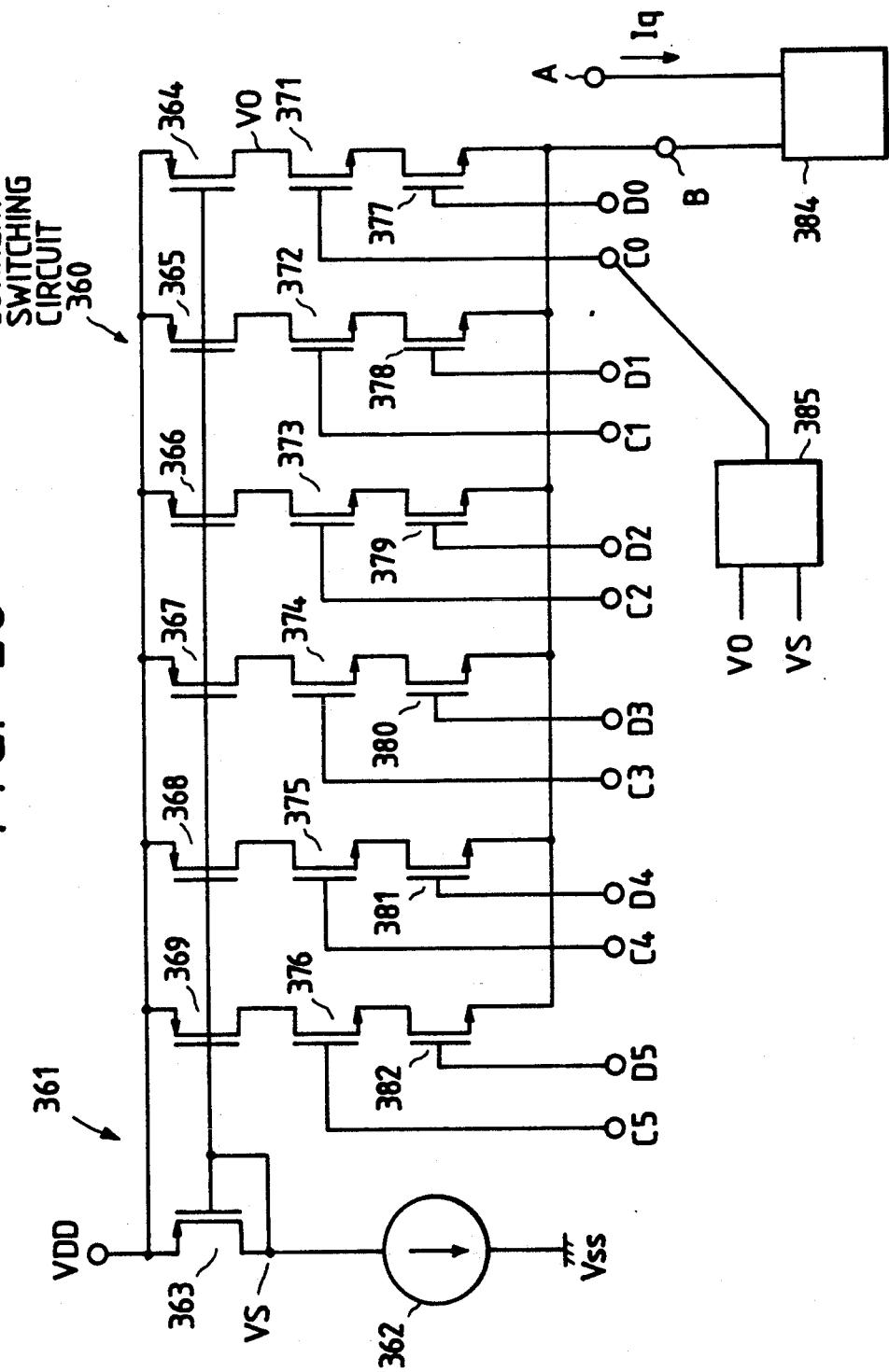
FIG. 28 is a diagram explaining a still further embodiment of the current switching circuit.

FIG. 28 illustrates a still further embodiment of the current switching circuit. The current switching circuit 360 shown in FIG. 28 has a bias circuit 361 constituted by a constant-current source circuit 362 and a P-channel MOSFET 363 that is diode-connected thereto, and further has six P-channel constant-current source MOSFETs 364 to 369 that receive a bias voltage output from the bias circuit 361. Though there is no particular limitation, the constant-current source MOSFETs 364 to 369 have sizes that are so determined as to flow currents I to 32I weighed by the power of 2.

To the constant-current source MOSFETs 364 to 369 are connected in series the N-channel control MOSFETs 371 to 376 and the N-channel select MOSFETs 377 to 382, and the source electrodes of the select MOSFETs 377 to 382 are commonly connected to the terminal B. Corresponding bits of the digital signals D0 to D5 are supplied to the gate electrodes of the select MOSFETs 377 to 382, so that they are switched depending upon the logic values. Control signals C0 to C5 are supplied to the gate electrodes of the control MOSFETs 371 to 376 to control the conductances of the corresponding control MOSFETs. The terminal B is coupled to a current mirror circuit 384, and a current flowing to the terminal B is reflected by the current mirror circuit 384 to form a drawing current Iq.

Here, the control MOSFETs 371 to 376 work as variable resistors being controlled by control signals C0 to C5. That is, when the potential at the terminal B varies depending upon the magnitude of the current flowing into the terminal B, the drain voltages of the constant-current source MOSFETs 364 to 369 tend to vary depending thereupon. Here, however, conductances of the MOSFETs 371 to 376 are controlled by the control signals C0 to C5 to cancel the changes. For instance, a drain voltage VO of MOSFET 371 and a drain voltage VS of MOSFET 363 are supplied to the inverted input terminal and to the non-inverted input terminal of the operational amplifier, and control means 385 is provided to form a control signal CO to obtain a predetermined gain depending upon a difference thereof. Other control signals can be formed in the same manner. Therefore, the constant-current source MOSFETs 364 to 369 are placed under the same operation condition irrespective of the values of the digital signals, making it possible to guarantee linear characteristics of the drawing current for the digital signals.

Figure 29:
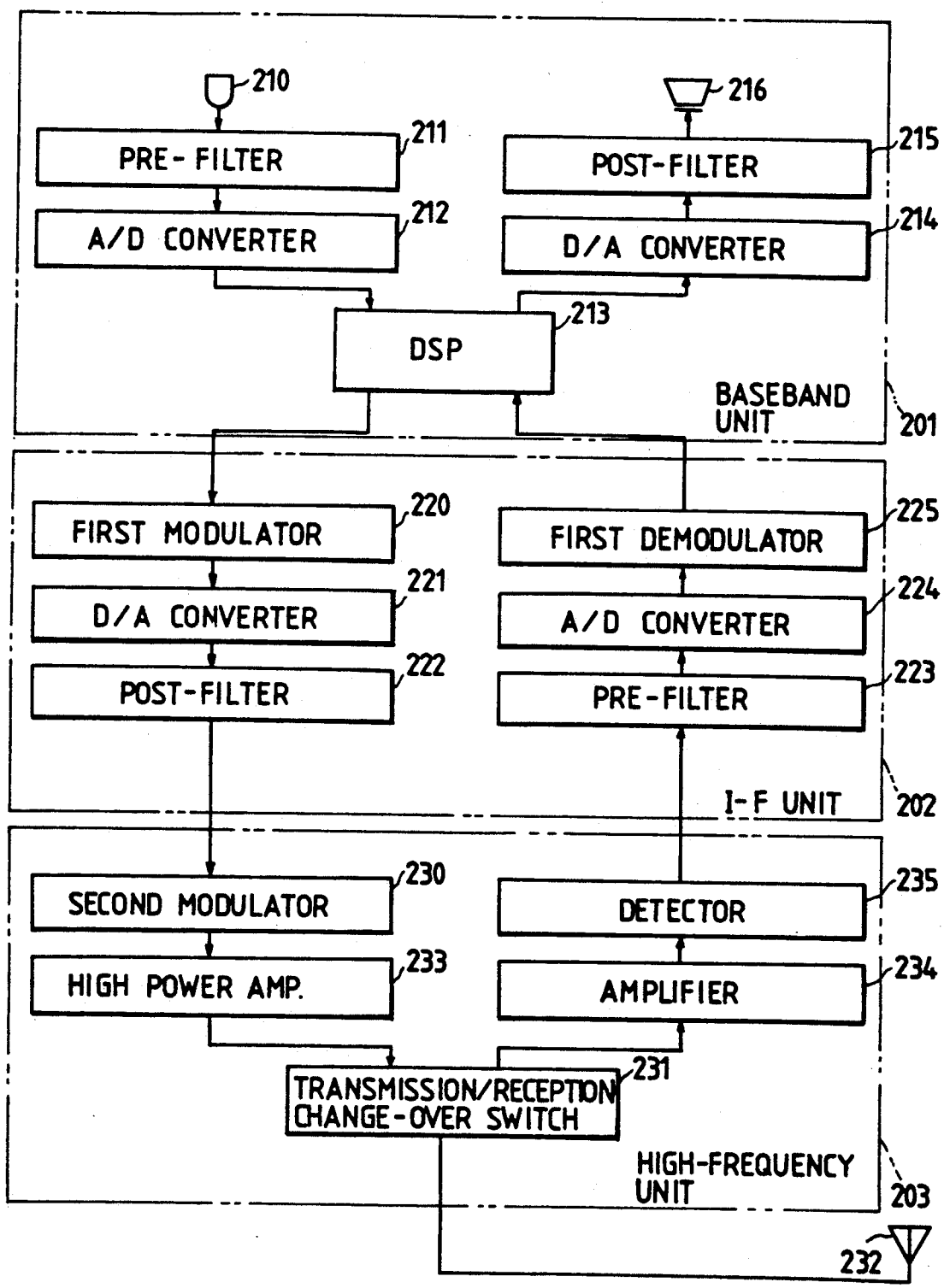
FIG. 29 is a block diagram of a portable communication terminal system including the A/D converter of the present invention.

FIG. 29 shows a portable communication terminal equipment mounting the A/D converter according to the present invention. The portable communication terminal equipment is constituted by a baseband unit 01, an intermediate-frequency unit 202 and a high-frequency unit 203.

The baseband unit 201 is constituted by a pre-filter 211 which suppresses the high noise components among the transmitted analog voice signals input through a microphone 210, an A/D converter 212 of the present invention which converts the outputs thereof into digital signals, a digital signal processor (hereinafter often referred to as DSP) 213 which compresses the band of the outputs thereof by treating the digital signals and which further expands the band-compressed received digital voice signals to the original band contrary to the above, a D/A converter 214 which converts the band-expanded outputs of the DSP 213 into analog voice signals, a post-filter 215 which suppresses the harmonic components contained in the outputs thereof and then amplifies the outputs, and a speaker 216 that is driven by the output of the post-filter 215.

The intermediate-frequency unit 202 is constituted by a first modulator 220 which effects the modulation for the signals output from the DSP 213 to be adapted to radio transmission, e.g., Gaussian minimum shift keying modulation or $\pi/4$ shift QPSK modulation, a D/A converter 221 that converts the outputs thereof into analog signals, a post-filter 222 which suppresses the harmonic components included in the outputs thereof, a pre-filter 223 which suppresses wide-band noise components included in the received modulated signals contrary to the above, an A/D converter 224 of the present invention which converts the outputs of the pre-filter 223 into digital signals, and a first demodulator 225 which demodulates the outputs of the A/D converter 224 into the original basic signal components.

The high-frequency unit 203 is constituted by a second modulator 230 which modulates the signals output from the post-filter 222 with radio-frequency carrier signals of, for example, about 800 MHz to 2 GHz, a high-power amplifier 233 which amplifies the output of the modulator 230 up to a predetermined transmission power to excite an antenna 232 via a transmission/reception change-over switch 231, an amplifier 234 which amplifies the signals received via the antenna 232 and the switch 231, and a detector 235 that detects desired signals, from the outputs of the amplifier 234. Though not diagrammed, provision is further made of a key pad, a dial signal generator, a calling signal generator, a control microcomputer, a clock signal generator, and a power source circuit based on a battery.

The A/D converters 212 and 224 included in the portable communication terminal equipment are the over-sampling A/D converters of the current integration type mentioned earlier, which consume small amounts of electric power and operate on a low power source voltage while maintaining a high conversion accuracy, and are most adapted to be driven by the battery. Even when the base band unit 201 and the intermediate-frequency unit 202 are separately or integrally mounted on a single chip of an analog/digital mixed large-scale semiconductor integrated circuit, high reliability is maintained since conversion characteristics of the A/D converters 212 and 224 are little affected by the infiltration of digital noise from the logic circuitry such as the DSP 213.

In the foregoing was concretely described the present invention accomplished by the present inventors by way of specific embodiments. It should, however, be noted that the present invention is in no way limited thereto only but can be modified in a variety of other ways without departing from the gist and scope of the invention.

In the aforementioned embodiments, for instance, the A/D converter was specifically provided with a sampling switch. The present invention, however, is not limited thereto only; e.g., the determination timing of the comparator included in the quantizing circuit may be brought in synchronism with the sampling timing. Moreover, the current switching circuit explained to be adapted to the over-sampling A/D converter can further be adapted to a single unit of the D/A converter.

Briefly described below are the effects obtained by a representative example of the inventions disclosed in the present application.

That is, using the A/D converter of the present invention, it is allowed to realize the analog integration circuit without using an operational amplifier circuit of high speed and large output. Moreover, since a change in the amplitude of integration operation is reduced, the over-sampling A/D converter can be operated on a decreased power source voltage, contributing to reducing the consumption of electric power. Moreover, when the A/D converter is realized in the form of a semiconductor integrated circuit, the chip area can be decreased and the characteristics are prevented from being deteriorated by the infiltration of noise that inevitably developed in the conventional imaginary ground-type integration circuit that uses the operational amplifier circuit. Furthermore, the band for converting signals can be widened beyond that which was limited by the speed of operation of the operational, amplifier circuit despite the increased current consumption.

Owing to the level-shifting function of the voltage-to-current converter circuit in the current integration-type of A/D converter, the output point at which the voltage-to-current converter circuit and the current switching circuit are connected together can be biased by a voltage which is roughly equal to the dc bias voltage superposed on the input analog voltage signal, and the reference voltage of the voltage comparator can be quantized as the dc bias voltage, maintaining a maximum sensitivity.

The sampling pulse generator circuit that sets the pulse width ($\tau$) of the sampling pulse signals to be nearly equal to the time constant cR of the analog integration circuit is capable of automatically compensating the effects upon the integration characteristics caused by changes in the element constants, and can further promote accuracy and stability of operation such as of the interpolation-type A/D converter and the like.

The current switching circuit of the present invention that can be adapted to the local D/A converter in the current integration-type A/D converter, reflects the current, corresponding to a logical value of digital signals in the current output path via a current mirror circuit, and synthesizes and outputs the reflected currents without substantially changing the conductance of the constant current-source transistor that constitutes the constant-current source circuit irrespective of the magnitude of current at the output terminal. Therefore, when the output current at the output terminal is controlled by the digital signals having various values, highly accurate linear characteristics are imparted to the output current that changes in response to the digital signals.

When the current switching circuit is employed as the local D/A converter in the over-sampling A/D converter of the analog integration type, furthermore, the output current of the current switching circuit forms a difference current relative to a current signal converted by the input voltage-to-current conversion means. The difference current is highly accurately controlled depending upon the digital signals, and the conversion accuracy of the over-sampling A/D converter is enhanced.

What is claimed is:

1. An analog-to-digital converter comprising:
   a voltage-to-current converter circuit for converting an input analog signal into a current that corresponds to a voltage amplitude thereof;
   a current switching circuit for outputting an output current that is controlled on the basis of digital signals consisting of a plurality of bits;
   an analog integration circuit coupled to a common connection point where an output point of said voltage-to-current converter circuit and an output point of said current switching circuit are commonly connected together, and, wherein said analog integration circuit includes a capacitor element connected between said common connection point and a predetermined DC potential;
   a quantizing circuit including a voltage comparator for comparing a voltage signal obtained via said analog integration circuit with a predetermined threshold voltage; and
   a digital integration circuit for integrating an output of said quantizing circuit,
   wherein said digital integration circuit outputs said digital signals.

2. An analog-to-digital converter according to claim 1, wherein said digital integration circuit adds said output current of said quantizing circuit to a current obtained by integrating said output current.

3. An analog-to-digital converter according to claim 2, wherein said analog integration circuit has a transfer function $F(Z) = 1/(1 - Z^{-1})$.

4. An analog-to-digital converter according to claim 3, wherein said digital integration circuit has a transfer function $G(Z) = [Z^{-1} \cdot (2 - Z^{-1})]/(1 - Z^{-1})$.

5. An analog-to-digital converter according to claim 1, wherein said common connection point is directly coupled to an input terminal of said quantizing circuit.

6. An analog-to-digital converter according to claim 1, wherein said common connection point is coupled to an input terminal of said quantizing circuit without interposing an operational amplifier therebetween.

7. An analog-to-digital converter comprising:
   a voltage-to current converter circuit for converting an input analog signal into a current that corresponds to a voltage amplitude thereof;
   a current switching circuit for outputting an output current that is controlled on the basis of digital signals;
   an analog integration circuit coupled to a common connection point where an output point of said voltage-to-current converter circuit and an output point of said current switching circuit are commonly connected together, wherein said analog integration circuit includes a capacitor element and a resistor element coupled in series between a predetermined DC potential and a common connection point;
   a quantizing circuit including a voltage comparator for comparing a voltage signal obtained via said analog integration circuit with a predetermined threshold voltage; and
   a digital integration circuit for integration an output of said quantizing circuit,
   wherein said digital integration circuit outputs said digital signals for transmission to said current switching circuit.

8. An analog-to-digital converter according to claim 7, wherein the ratio of input voltage to unit output current of said voltage-to-current converter circuit is set to be equal to the resistance of the resistor element included in said analog integration circuit.

9. An analog-to-digital converter according to claim 8, further comprising a switching element controlled by a sampling pulse signal between said analog integration circuit and the common connection point, the pulse width of said sampling pulse signal being set to be nearly equal to a value that is determined by the product of said resistance and a capacitance of a capacitor element included in said analog integration circuit, in order to control the period of sampling operation of the analog integration circuit.

10. An analog-to-digital converter according to claim 8, wherein said voltage-to-current converter circuit is periodically operated in response to sampling pulse signals, and the pulse width that determines the period of operation is set to be nearly equal to a value that is determined by the product of said resistance and the capacitance of said capacitor element.

11. An analog-to-digital converter according to claim 10, wherein said current switching circuit includes a plurality of constant-current source circuits that are weighed by the power of 2, and a switching means for coupling said common connection point to at least one predetermined constant-current source circuit among said plurality of constant-current source circuits, said switching means being controlled in synchronism with a change in said sampling pulse signals.

12. An analog-to-digital converter according to claim 7, wherein said common connection point is directly coupled to an input terminal of said quantizing circuit.

13. An analog-to-digital converter according to claim 7, wherein said common connection point is coupled to an input terminal of said quantizing circuit without interposing an operational amplifier therebetween.

14. An analog-to-digital converter, comprising:
a voltage-to-current converter circuit for converting an input analog signal into a current that corresponds to a voltage amplitude thereof;
a current switching circuit for outputting current that are selectively controlled by digital output signals consisting of a plurality of bits;
a resistor element coupled between a predetermined DC potential point and a common connection point at which an output point of said voltage-to-current converter circuit and an output point of said current switching circuit are connected together;
a quantizing circuit having at least one voltage comparator for comparing a voltage signal obtained at said common connection pint via said resistor element with a predetermined threshold voltage; and
a digital integration circuit for integrating the output of said quantizing circuit and for inputting said integrated output as a digital signal to said current switching circuit.

15. An analog-to-digital converter according to claim 14, wherein said voltage-to-current converter circuit includes an operational amplifier circuit, said input analog voltage signal is applied to the inverted input terminal of said amplifier circuit via a resistance element, a DC voltage smaller than a DC bias voltage superposed on said input analog voltage signal is fed to the non-inverted input terminal of said amplifier circuit, the gate electrode of a first N-channel MOS transistor is connected to the output of said operational amplifier circuit, the source electrode of said first N-channel MOS transistor being connected to the inverted input terminal of said amplifier circuit, a first P-channel MOS transistor and a second N-channel MOS transistor through which constant currents flow are respectively connected to the rain and source electrodes of said first N channel MOS transistor, and the drain electrode of said first N-channel MOS transistor is a current output point of said voltage-to-current converter circuit.

16. An analog-to-digital converter according to claim 14, wherein said common connection point is directly coupled to an input terminal of said quantizing circuit.

17. An analog-to-digital converter according to claim 14, wherein said common connection point is coupled to an input terminal of said quantizing circuit without interposing an operational amplifier therebetween.

18. An analog-to-digital converter comprising:
a voltage-to-current converter circuit for converting an input analog signal into a current that corresponds to a voltage amplitude thereof;
a current switching circuit;
an analog circuit coupled to a common connection point where an output point of said voltage-to-current converter circuit and an output point of said current switching circuit are commonly connected together, and which is constituted by a passive element that receives a difference current in the currents between the two output points;
a quantizing circuit consisting of at least one or more voltage comparators for comparing a voltage signal obtained via said analog circuit with a predetermined threshold voltage; and
a digital circuit that forms digital signals to be supplied to said current switching circuit based on the output of said quantizing circuit;
wherein said voltage-to-current converter circuit includes a source follower circuit whose both terminals are coupled to a current source, and an operational amplifier having an output coupled to the input of the source follower circuit and which is provided an analog voltage signal through an inverted input terminal thereof and with a reference potential through a non-inverted input terminal thereof, wherein said reference potential is lower than a DC bias voltage that is superposed on the input analog voltage signal, and wherein a current output point coupled to a drain contact of a transistor of the source follower circuit is biased by a voltage which is close to said DC bias voltage.

19. An analog-to-digital converter comprising:
a voltage-to-current converter circuit for converting an input analog signal into a current that corresponds to a voltage amplitude thereof;
a current switching circuit for outputting an output current controlled on the basis of digital signals;
an analog integration circuit coupled to a common connection point at which an output point of said voltage-to-current converter circuit and an output point of said current switching circuit are connected together, and which is coupled between said common connection point and a predetermined DC potential;
a quantizing circuit including a voltage comparator for comparing a voltage signal obtained via said analog integration circuit with a predetermined threshold voltage; and
a digital circuit for outputting said digital signals which are to be fed to said current switching circuit.

20. An analog-to-digital converter according to claim 19, wherein said analog integration circuit includes a capacitor.

21. An analog-to-digital converter according to claim 20, wherein said digital circuit delays an output current of said quantizing circuit.

22. An analog-to-digital converter according to claim 20, wherein said digital circuit integrates an output current of said quantizing circuit.

23. An analog-to-digital converter according to claim 22, wherein said digital circuit adds said output current of said quantizing circuit to a current obtained by integrating said output current of said quantizing circuit.

24. An analog-to-digital converter according to claim 19, wherein said voltage-co-current converter circuit includes a source follower circuit whose both terminals are coupled to a current source, and said operational amplifier having an output coupled to an input of a source follower circuit and which is provided an analog voltage signal through an inverted input terminal thereof and with a reference potential through a non-inverted input terminal thereof, wherein said reference potential is lower than a DC bias voltage that is superposed on said input analog signal, and wherein a current output point coupled to a drain of a transistor of said source follower circuit is biased by a voltage which is close to said DC bias voltage.

25. An analog-to-digital converter according to claim 19, wherein said common connection point is coupled to an input terminal of said quantizing circuit without interposing an operational amplifier therebetween.

* * * * *